(12) United States Patent
Hsu et al.

(10) Patent No.: US 10,141,401 B2
(45) Date of Patent: Nov. 27, 2018

(54) METHOD FOR FORMING SEMICONDUCTOR DEVICE STRUCTURE

(71) Applicant: TAIWAN SEMICONDUCTOR MANUFACTURING CO., LTD., Hsinchu (TW)

(72) Inventors: Shih-Lu Hsu, Tainan (TW); Ping-Pang Hsieh, Tainan (TW); Yu-Chu Lin, Tainan (TW); Jyun-Guan Jhou, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/606,302

(22) Filed: May 26, 2017

(65) Prior Publication Data

US 2017/0263464 A1 Sep. 14, 2017

Related U.S. Application Data

(62) Division of application No. 14/924,326, filed on Oct. 27, 2015, now Pat. No. 9,666,668.

(51) Int. Cl.
| | |
|---|---|
| H01L 27/088 | (2006.01) |
| H01L 29/06 | (2006.01) |
| H01L 29/78 | (2006.01) |
| H01L 29/66 | (2006.01) |

(Continued)

(52) U.S. Cl.
CPC .... *H01L 29/0649* (2013.01); *H01L 21/28123* (2013.01); *H01L 21/3085* (2013.01);
(Continued)

(58) Field of Classification Search
CPC ......... H01L 21/28123; H01L 21/30655; H01L 21/3085; H01L 29/04; H01L 29/0649;
(Continued)

(56) References Cited

U.S. PATENT DOCUMENTS

| | | | |
|---|---|---|---|
| 6,015,737 A * | 1/2000 | Tokura | H01L 29/045 |
| | | | 257/E29.004 |
| 6,017,800 A * | 1/2000 | Sayama | H01L 21/76235 |
| | | | 257/E21.55 |

(Continued)

*Primary Examiner* — Mohammed Shamsuzzaman
(74) *Attorney, Agent, or Firm* — Birch, Stewart, Kolasch & Birch, LLP

(57) ABSTRACT

A method for forming a semiconductor device structure is provided. The method includes performing a first plasma etching process on a substrate to form a first trench in the substrate. The method includes removing a second portion of the substrate under the bottom surface to form a second trench under and connected to the first trench. The second trench surrounds a third portion of the substrate under the first portion. The third portion has a first sidewall. The first sidewall is inclined relative to the top surface at a second angle, and the first angle is greater than the second angle. The method includes forming an isolation structure in the first trench and the second trench. The method includes forming a gate insulating layer over the top surface and the first inclined surface. The method includes forming a gate over the gate insulating layer and the isolation structure.

20 Claims, 23 Drawing Sheets

(51) Int. Cl.
*H01L 21/308* (2006.01)
*H01L 21/3065* (2006.01)
*H01L 21/28* (2006.01)
*H01L 29/423* (2006.01)
*H01L 29/10* (2006.01)
*H01L 29/04* (2006.01)

(52) U.S. Cl.
CPC ........ *H01L 21/30655* (2013.01); *H01L 29/04* (2013.01); *H01L 29/0657* (2013.01); *H01L 29/1037* (2013.01); *H01L 29/4238* (2013.01); *H01L 29/42376* (2013.01); *H01L 29/66575* (2013.01); *H01L 29/66795* (2013.01); *H01L 29/785* (2013.01)

(58) Field of Classification Search
CPC ............. H01L 29/0657; H01L 29/1037; H01L 29/42376; H01L 29/4238; H01L 29/66575; H01L 29/66795; H01L 29/785
USPC ......... 257/401, 499, 565, 618; 438/296, 270
See application file for complete search history.

(56) References Cited

U.S. PATENT DOCUMENTS

| | | | |
|---|---|---|---|
| 6,081,662 A * | 6/2000 | Murakami | H01L 21/76232 257/219 |
| 6,566,207 B2 * | 5/2003 | Park | H01L 21/76202 257/E21.55 |
| 6,825,544 B1 * | 11/2004 | Jin | H01L 21/76235 257/499 |
| 2002/0121673 A1 * | 9/2002 | Jono | H01L 21/76232 257/510 |
| 2004/0183141 A1 * | 9/2004 | Nakaoka | H01L 21/82341 257/402 |
| 2008/0277745 A1 | 11/2008 | Hsu et al. | |
| 2014/0151852 A1 * | 6/2014 | Adkisson | H01L 29/66242 257/565 |
| 2014/0252489 A1 | 9/2014 | Yu et al. | |
| 2014/0252557 A1 * | 9/2014 | Flachowsky | H01L 21/3083 257/618 |
| 2015/0340428 A1 * | 11/2015 | Lu | H01L 29/063 257/337 |

\* cited by examiner

METHOD FOR FORMING SEMICONDUCTOR DEVICE STRUCTURE

CROSS REFERENCE

This application is a Divisional of U.S. application Ser. No. 14/924,326, filed on Oct. 27, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
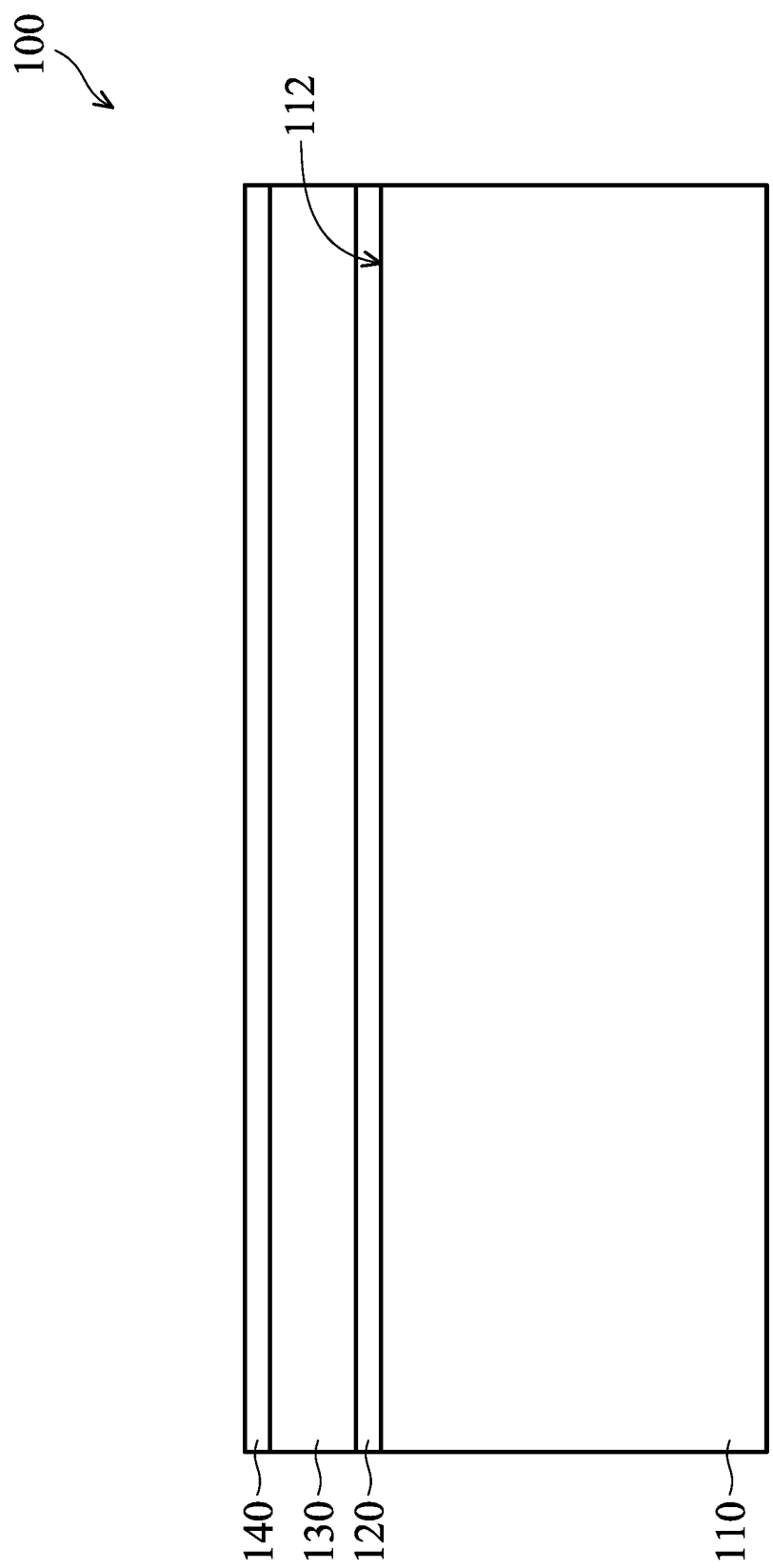
FIGS. 1A-1M are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1M are cross-sectional views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, a mask layer 120 is deposited over an top surface 112 of the substrate 110, in accordance with some embodiments. The mask layer 120 includes oxide (such as silicon oxide), in accordance with some embodiments. The mask layer 120 is deposited using a chemical vapor deposition process or a physical vapor deposition process, in accordance with some embodiments.

As shown in FIG. 1A, a mask layer 130 is deposited over the mask layer 120, in accordance with some embodiments. The mask layers 120 and 130 are made of different materials, in accordance with some embodiments. The mask layer 130 is thicker than the mask layer 120, in accordance with some embodiments. The mask layer 130 includes nitride (such as silicon nitride), in accordance with some embodiments. The mask layer 130 is deposited using a chemical vapor deposition process or a physical vapor deposition process, in accordance with some embodiments.

As shown in FIG. 1A, an anti-reflective layer 140 is formed over the mask layer 130, in accordance with some embodiments. The anti-reflective layer 140 includes a silicon oxide nitride (SiON) material or another suitable material. The anti-reflective layer 140 is formed using a chemical vapor deposition process or a physical vapor deposition process, in accordance with some embodiments.

Figure 1B:
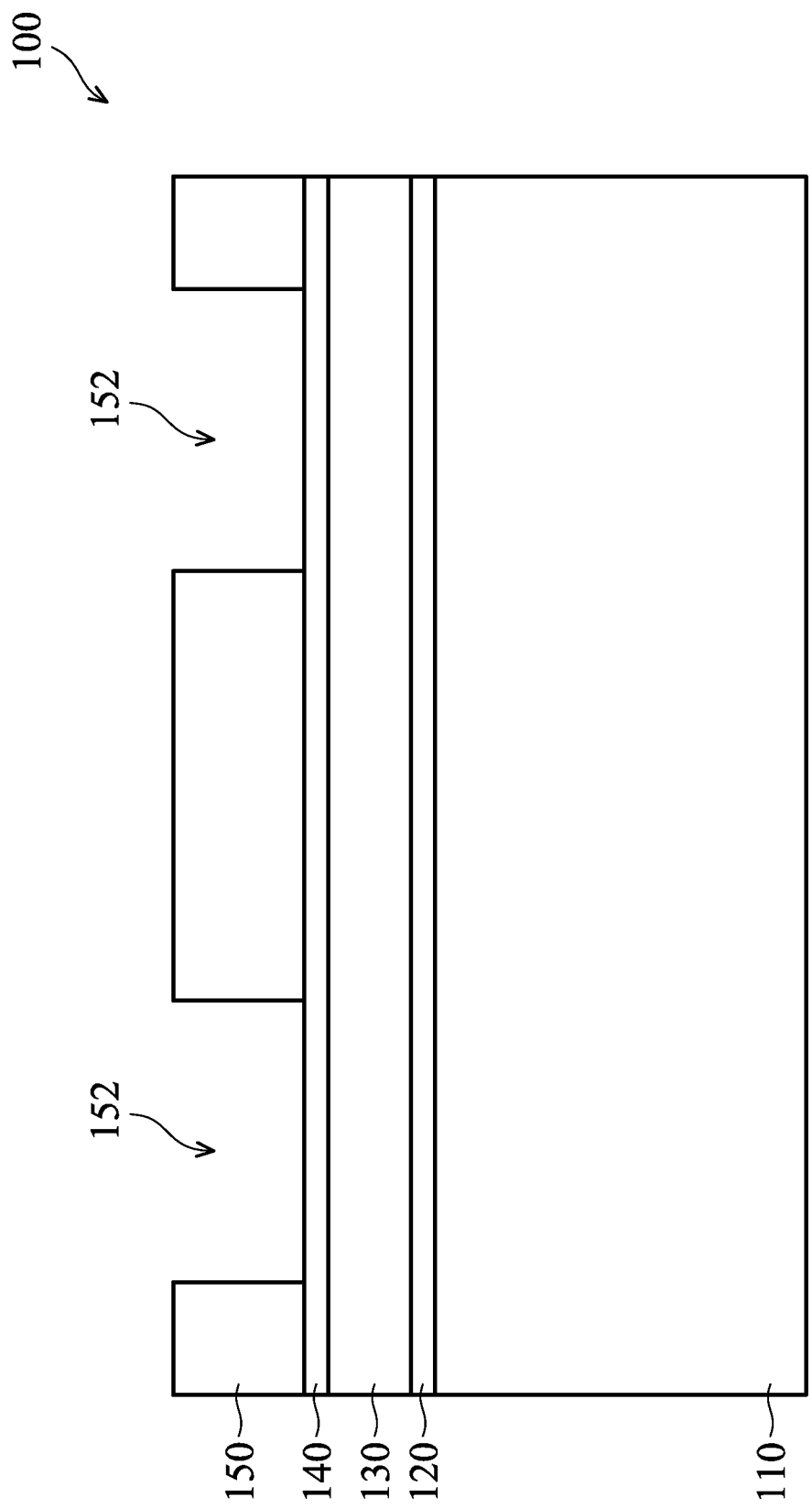

As shown in FIG. 1B, a photoresist layer 150 is formed over the anti-reflective layer 140, in accordance with some embodiments. The photoresist layer 150 has openings 152, in accordance with some embodiments. The openings 152 expose a portion of the anti-reflective layer 140, in accordance with some embodiments. The photoresist layer 150 is formed using a spin coating process and a photolithography process, in accordance with some embodiments.

Figure 1C:
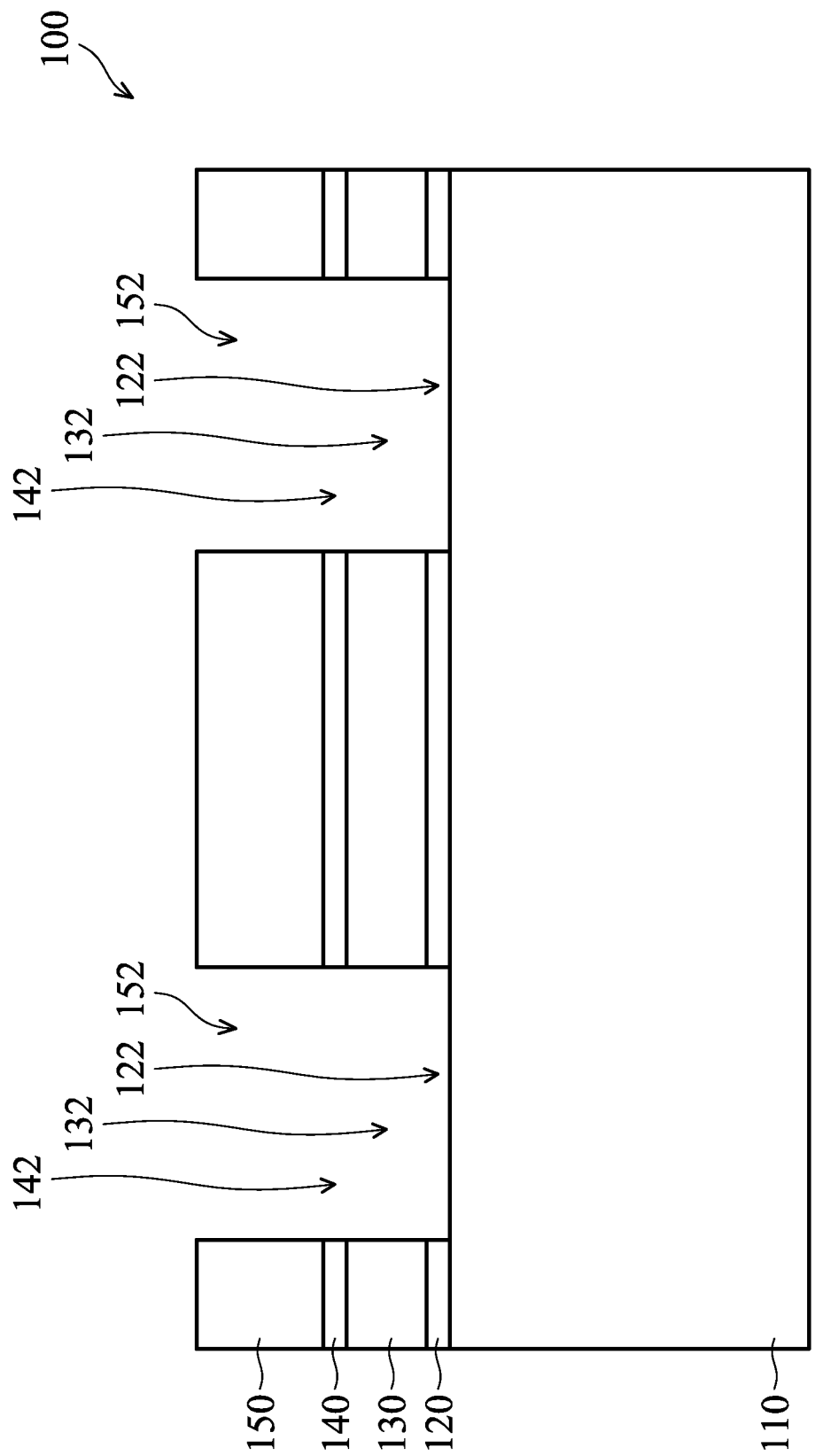

As shown in FIG. 1C, the anti-reflective layer 140 and the mask layers 130 and 120 under the openings 152 are removed through the openings 152, in accordance with some embodiments. The removal process includes a dry etching process, in accordance with some embodiments.

Figure 1D:
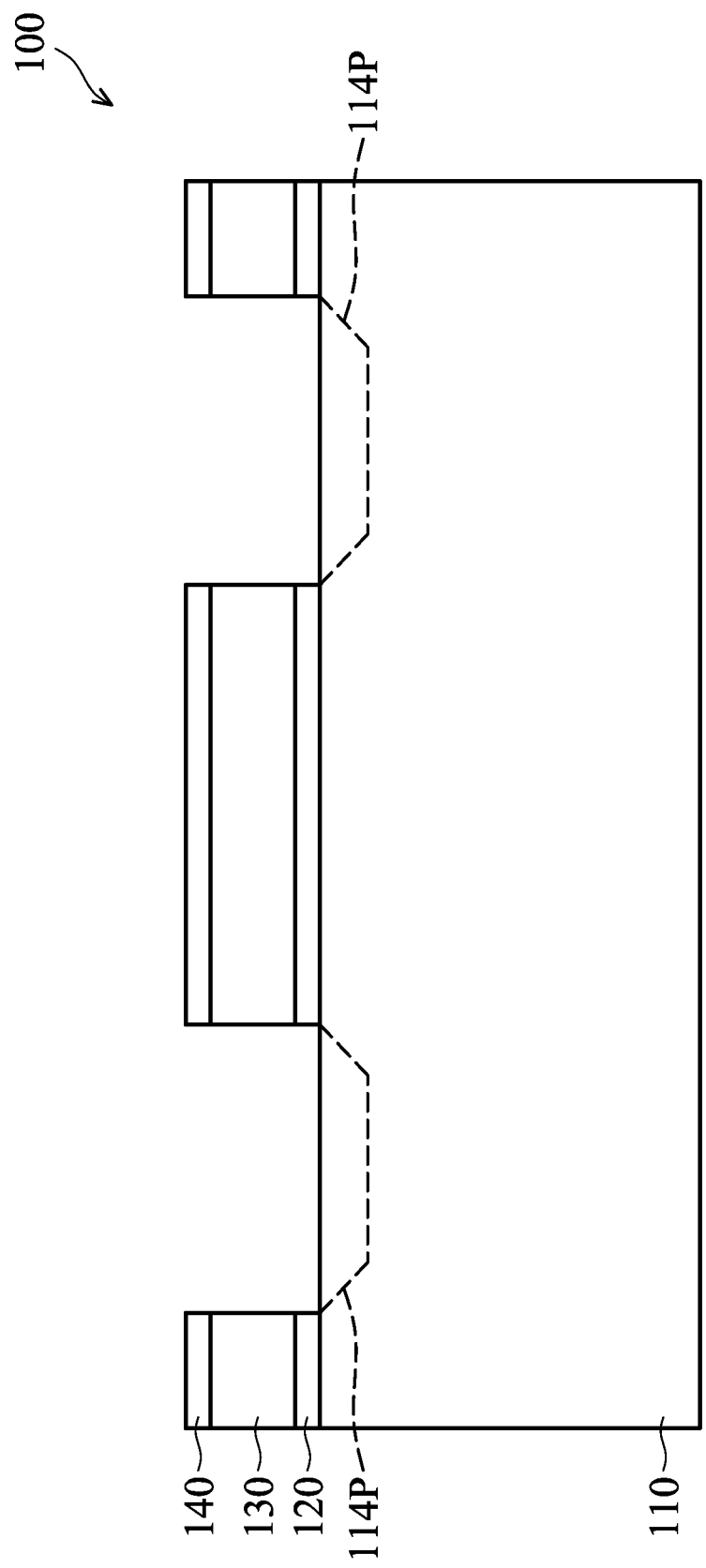

After the removal process, the anti-reflective layer 140 has openings 142 under the openings 152, the mask layer 130 has openings 132 under the openings 152, and the mask layer 120 has openings 122 under the openings 152, in accordance with some embodiments. The openings 152, 142, 132, and 122 expose a portion of the substrate 110, in accordance with some embodiments. As shown in FIG. 1D, the photoresist layer 150 is removed, in accordance with some embodiments.

Figure 1E:
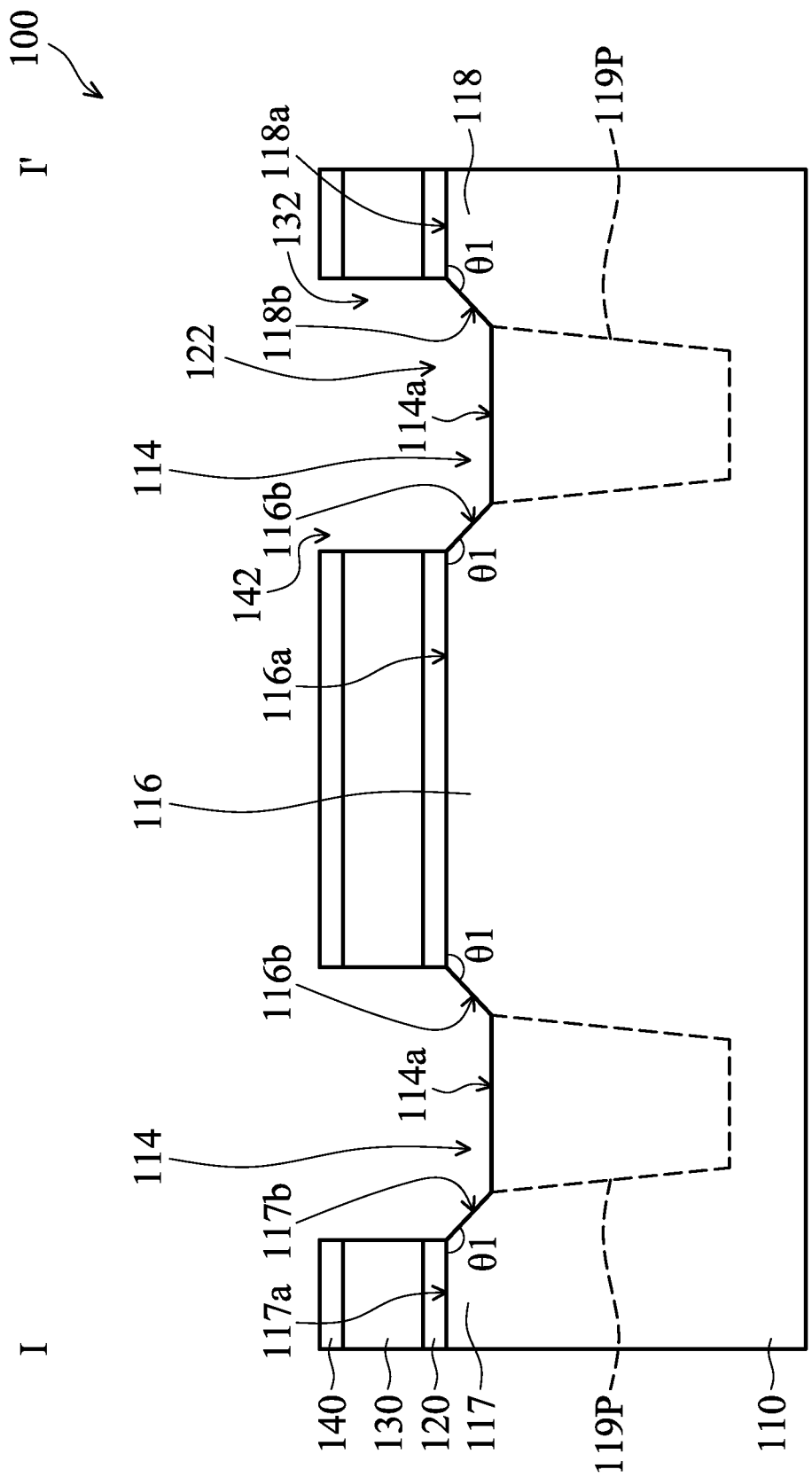
Figure 2A:
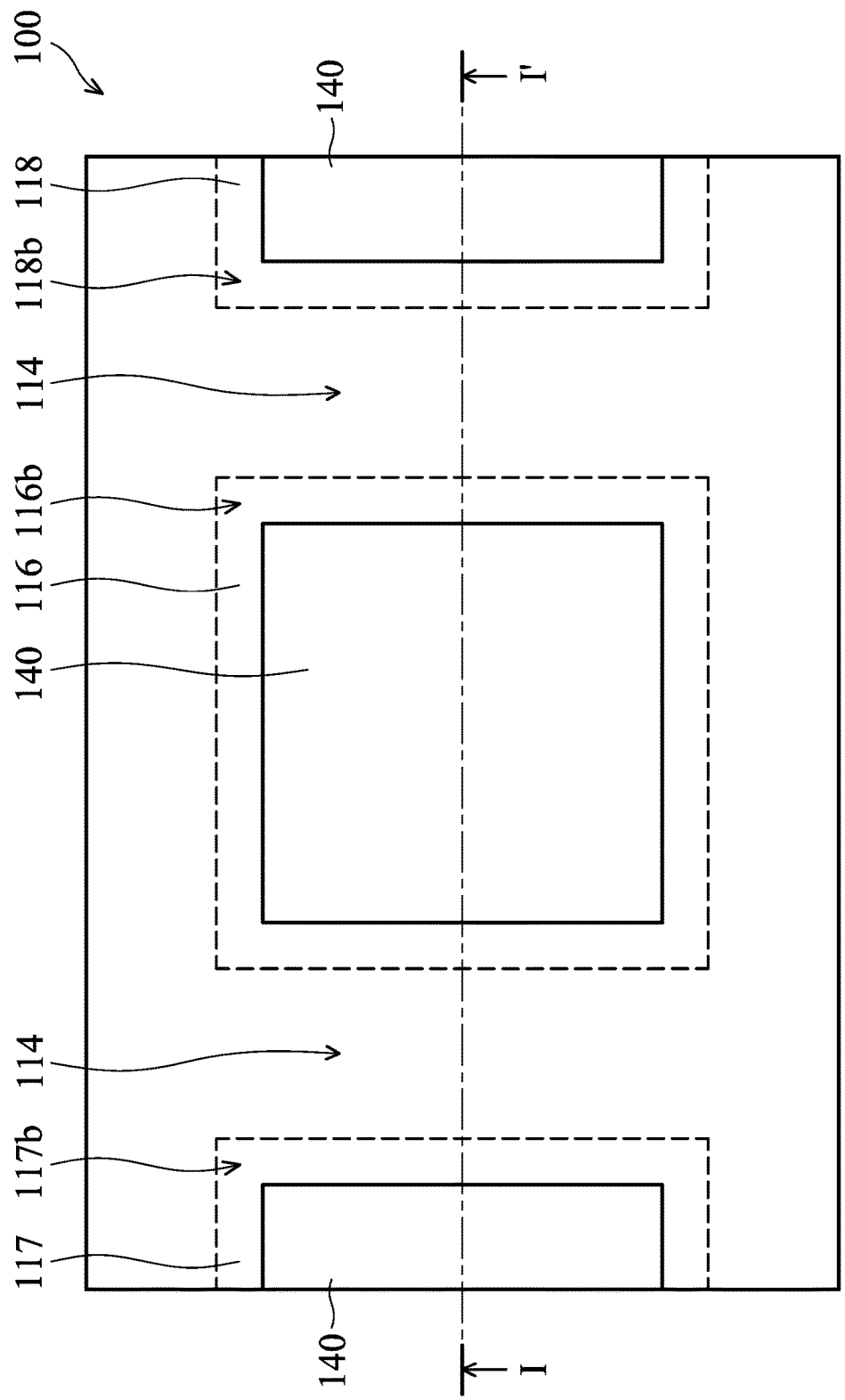
FIG. 2A is a top view of the semiconductor device structure of FIG. 1E, in accordance with some embodiments.

FIG. 2A is a top view of the semiconductor device structure 100 of FIG. 1E, in accordance with some embodiments. FIG. 1E is a cross-sectional view illustrating the semiconductor device structure 100 along a sectional line I-I' in FIG. 2A, in accordance with some embodiments.

As shown in FIGS. 1E and 2A, a taper etching process is performed to remove a portion 114P of the substrate 110 exposed by the openings 122, 132, and 142 through the openings 122, 132, and 142, in accordance with some embodiments. After the taper etching process, a trench 114 is formed in the substrate 110, in accordance with some embodiments.

The taper etching process includes a plasma etching process, in accordance with some embodiments. The plasma etching process uses an etching gas and a polymer gas, in accordance with some embodiments. The polymer gas is configured to provide a polymer deposition during the taper etching process, in accordance with some embodiments. The etching gas includes $CF_4$, $C_4F_6$, or another suitable etching gas. The polymer gas includes $CH_2F_2$, $CH_3F$, $CHF_3$, or another suitable polymer gas.

The trench 114 surrounds portions 116, 117, and 118 of the substrate 110, in accordance with some embodiments. The portion 116 has a top surface 116a and inclined surfaces 116b, in accordance with some embodiments. The inclined surfaces 116b are inclined relative to the top surface 116a at a first angle $\theta 1$, in accordance with some embodiments. The first angle $\theta 1$ ranges from about 110° to about 160°, in accordance with some embodiments. The inclined surfaces 116b connect the top surface 116a to the bottom surface 114a of the trench 114, in accordance with some embodiments.

The portion 117 has a top surface 117a and inclined surfaces 117b, in accordance with some embodiments. The inclined surfaces 117b are inclined relative to the top surface 117a at the first angle $\theta 1$, in accordance with some embodiments. The first angle $\theta 1$ ranges from about 110° to about 160°, in accordance with some embodiments. The inclined surfaces 117b connect the top surface 117a to the bottom surface 114a of the trench 114, in accordance with some embodiments.

The portion 118 has a top surface 118a and inclined surfaces 118b, in accordance with some embodiments. The inclined surfaces 118b are inclined relative to the top surface 118a at the first angle $\theta 1$, in accordance with some embodiments. The first angle $\theta 1$ ranges from about 110° to about 160°, in accordance with some embodiments. The inclined surfaces 118b connect the top surface 118a to the bottom surface 114a of the trench 114, in accordance with some embodiments.

Figure 1F:
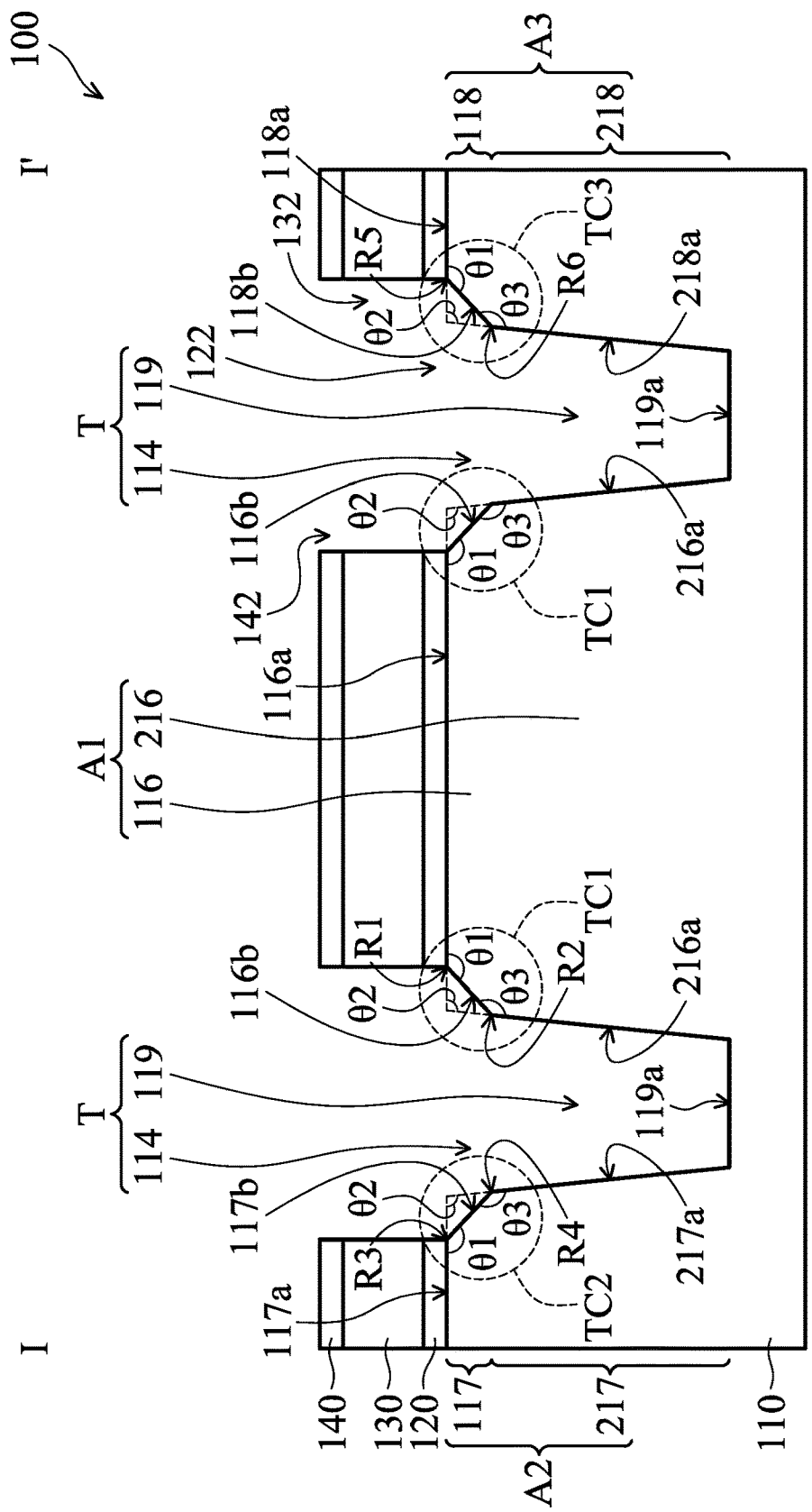
Figure 2B:
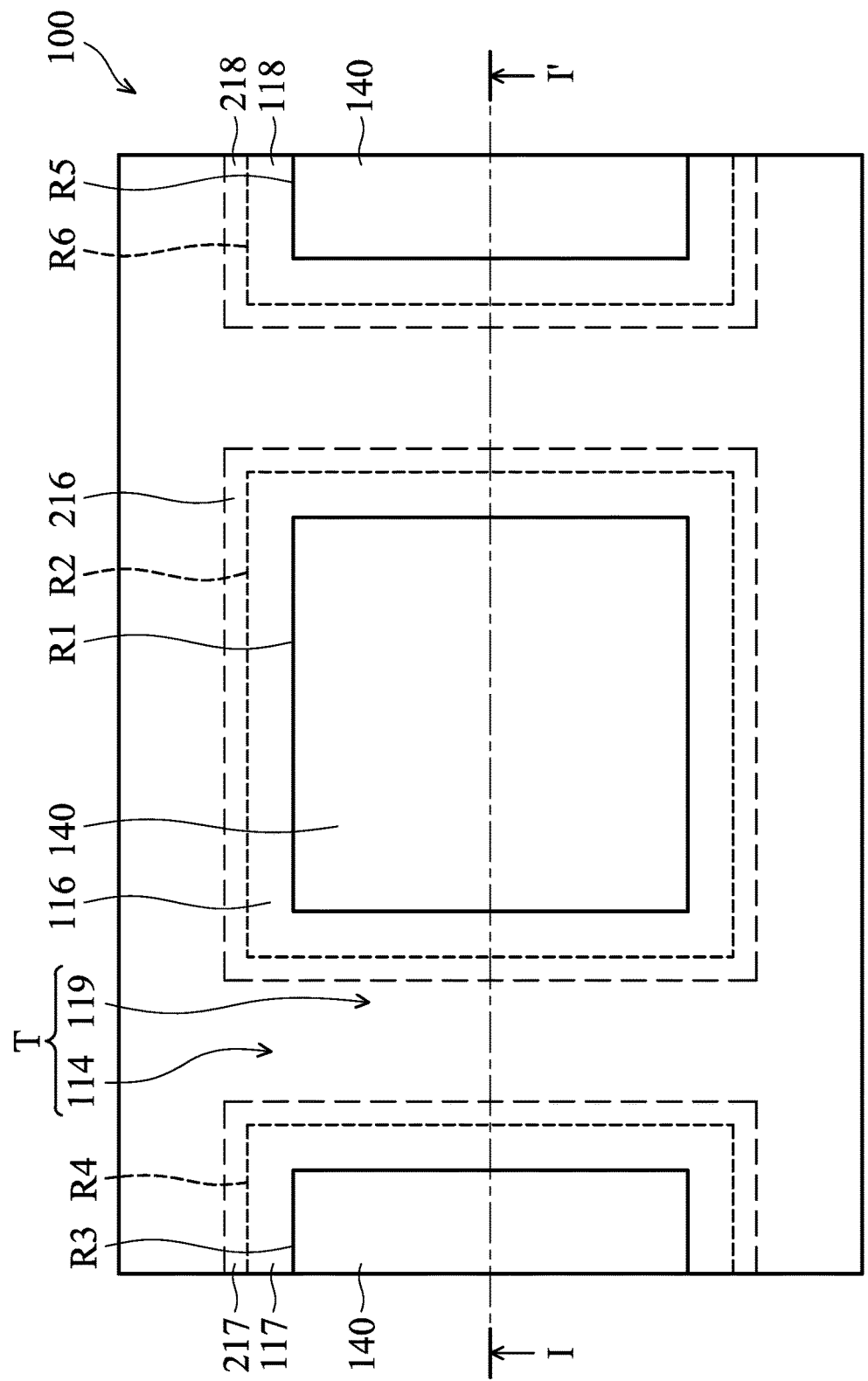
FIG. 2B is a top view of the semiconductor device structure of FIG. 1F, in accordance with some embodiments.
Figure 3:
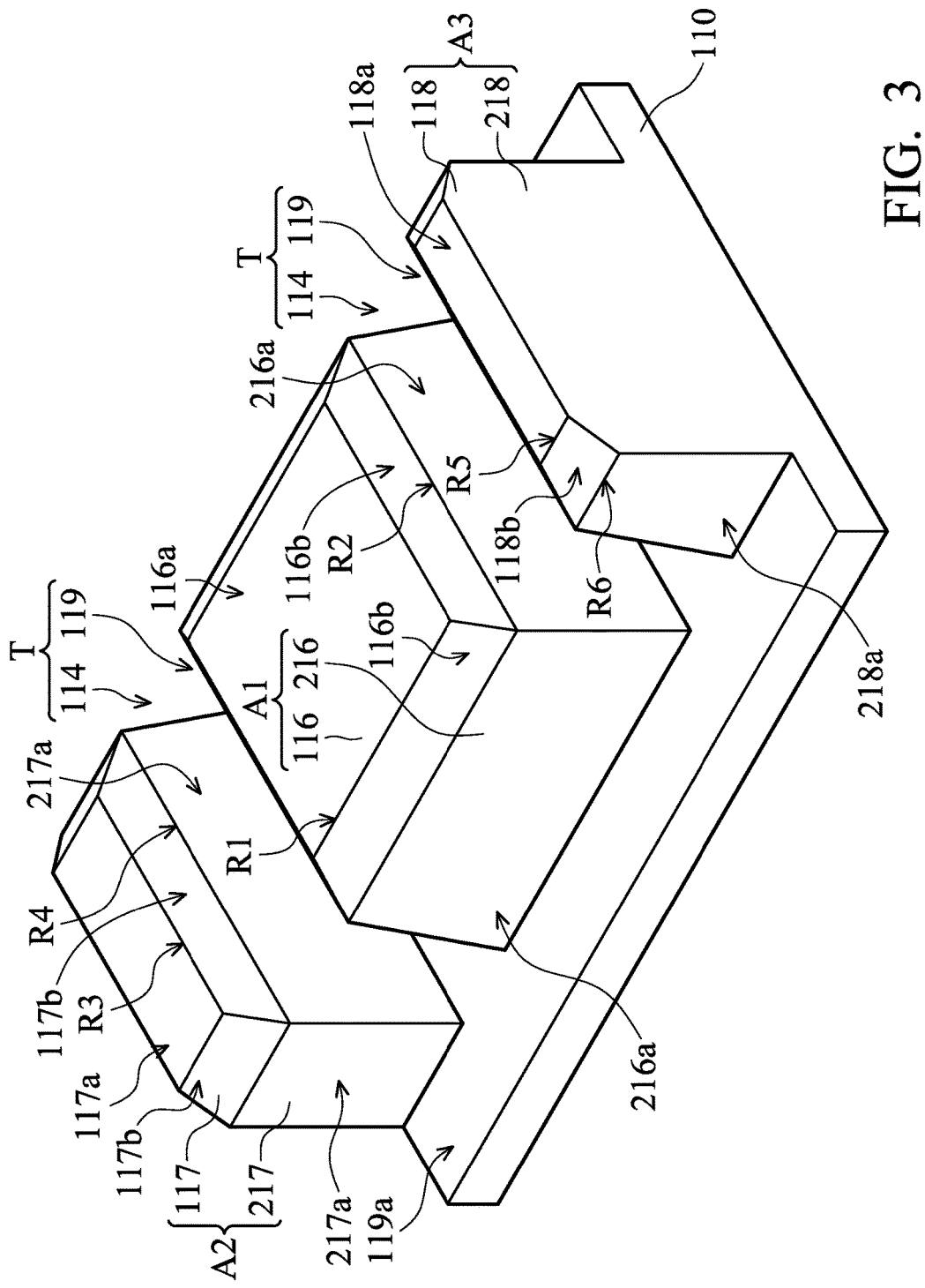
FIG. 3 is a perspective view illustrating the substrate of FIG. 1F, in accordance with some embodiments.

FIG. 2B is a top view of the semiconductor device structure 100 of FIG. 1F, in accordance with some embodiments. FIG. 1F is a cross-sectional view illustrating the semiconductor device structure 100 along a sectional line I-I' in FIG. 2B, in accordance with some embodiments. FIG. 3 is a perspective view illustrating the substrate 110 of FIG. 1F, in accordance with some embodiments.

As shown in FIGS. 1F, 2B, and 3, a portion 119P of the substrate 110 under the bottom surface 114a is removed through the openings 122, 132, and 142 and the trench 114, in accordance with some embodiments. After the removal process, a trench 119 is formed in the substrate 110, in accordance with some embodiments. The trench 119 is under the trench 114, in accordance with some embodiments.

The trench 119 is connected to the trench 114, in accordance with some embodiments. The trenches 114 and 119 together form a trench T, in accordance with some embodiments. The trench 119 surrounds portions 216, 217, and 218 of the substrate 110, in accordance with some embodiments. In some embodiments, the portions 116, 119P, 216, and 114P are also respectively referred to as a first portion, a second portion, a third portion, and a fourth portion. In some other embodiments, the portions 114P and 119P are also respectively referred to as a first portion and a second portion.

The portions 216, 217, and 218 are under the portions 116, 117, and 118 respectively, in accordance with some embodiments. The portions 116 and 216 are together form an active island A1, in accordance with some embodiments. The portions 117 and 217 are together form an active island A2, in accordance with some embodiments. The portions 118 and 218 are together form an active island A3, in accordance with some embodiments.

As shown in FIGS. 1F, 2B, and 3, the portion 216 has sidewalls 216a, in accordance with some embodiments. The sidewalls 216a are inclined relative to the top surface 116a at a second angle $\theta 2$, in accordance with some embodiments. The first angle $\theta 1$ is greater than the second angle $\theta 2$, in accordance with some embodiments.

The second angle $\theta 2$ ranges from about 90° to about 100°, in accordance with some embodiments. The inclined surface 116b is inclined relative to the sidewall 216a at a third angle $\theta 3$, in accordance with some embodiments. The third angle $\theta 3$ ranges from about 110° to about 170°, in accordance with some embodiments.

The inclined surface 116b connects the top surface 116a to the sidewall 216a thereunder, in accordance with some embodiments. The inclined surface 116b directly connects the top surface 116a to the sidewall 216a thereunder, in accordance with some embodiments. There are no other surfaces between the inclined surface 116b and the top surface 116a, in accordance with some embodiments. There are no other surfaces between the inclined surface 116b and the sidewall 216a thereunder, in accordance with some embodiments.

As shown in FIGS. 1F, 2B, and 3, a ridge line R1 is between the top surface 116a and the inclined surface 116b, in accordance with some embodiments. In some embodiments, a ridge line R2 is between the inclined surface 116b and the sidewall 216a. The ridge lines R1 and R2 are spaced apart from each other, in accordance with some embodiments.

As shown in FIGS. 1F, 2B, and 3, the portion 217 has sidewalls 217a, in accordance with some embodiments. The sidewalls 217a are inclined relative to the top surface 117a at a second angle θ2, in accordance with some embodiments. The first angle θ1 is greater than the second angle θ2, in accordance with some embodiments.

The second angle θ2 ranges from about 90° to about 100°, in accordance with some embodiments. The inclined surface 117b is inclined relative to the sidewall 217a at a third angle θ3, in accordance with some embodiments. The third angle θ3 ranges from about 110° to about 170°, in accordance with some embodiments.

If the first angle θ1 is less than 110°, the stress at the top corners TC1, TC2, and TC3 of the active islands A1, A2, and A3 may be too great to form a gate insulating layer thereon. If the first angle θ1 is greater than 160° (i.e. the third angle θ3 is less than 120°), the stress at the top corners TC1, TC2, and TC3 of the active islands A1, A2, and A3 may be too great to form a gate insulating layer thereon.

As shown in FIGS. 1F, 2B, and 3, a ridge line R3 is between the top surface 117a and the inclined surface 117b, in accordance with some embodiments. In some embodiments, a ridge line R4 is between the inclined surface 117b and the sidewall 217a. The ridge lines R3 and R4 are spaced apart from each other, in accordance with some embodiments.

As shown in FIGS. 1F, 2B, and 3, the portion 218 has sidewalls 218a, in accordance with some embodiments. The sidewalls 218a are inclined relative to the top surface 118a at a second angle θ2, in accordance with some embodiments. The first angle θ1 is greater than the second angle θ2, in accordance with some embodiments.

The second angle θ2 ranges from about 90° to about 100°, in accordance with some embodiments. The inclined surface 118b is inclined relative to the sidewall 218a at a third angle θ3, in accordance with some embodiments. The third angle θ3 ranges from about 110° to about 170°, in accordance with some embodiments.

As shown in FIGS. 1F, 2B, and 3, a ridge line R5 is between the top surface 118a and the inclined surface 118b, in accordance with some embodiments. In some embodiments, a ridge line R6 is between the inclined surface 118b and the sidewall 218a. The ridge lines R5 and R6 are spaced apart from each other, in accordance with some embodiments. In some embodiments, the top surfaces 116a, 117a, and 118a, the sidewall 216a, 217a, and 218a, and the inclined surface 116b, 117b, and 118b are substantially planar surfaces.

The removal process includes a plasma etching process, in accordance with some embodiments. The plasma etching process uses an etching gas, in accordance with some embodiments. The plasma etching process further uses a polymer gas, in accordance with some embodiments. The polymer gas is configured to provide a polymer deposition during the plasma etching process, in accordance with some embodiments. The etching gas includes $CF_4$, $C_4F_6$, or another suitable etching gas. The polymer gas includes $CH_2F_2$, $CH_3F$, $CHF_3$, or another suitable polymer gas.

In some embodiments, the polymer gas used in the taper etching process has a first concentration which is greater than a second concentration of the polymer gas used in the removal process for forming the trench 119. Therefore, relative to the bottom surface 111 or the top surfaces 116a, 117a, and 118a, the inclined surfaces 116b are more inclined than the sidewalls 216a, the inclined surfaces 117b are more inclined than the sidewalls 217a, and the inclined surfaces 118b are more inclined than the sidewalls 218a.

Figure 1G:
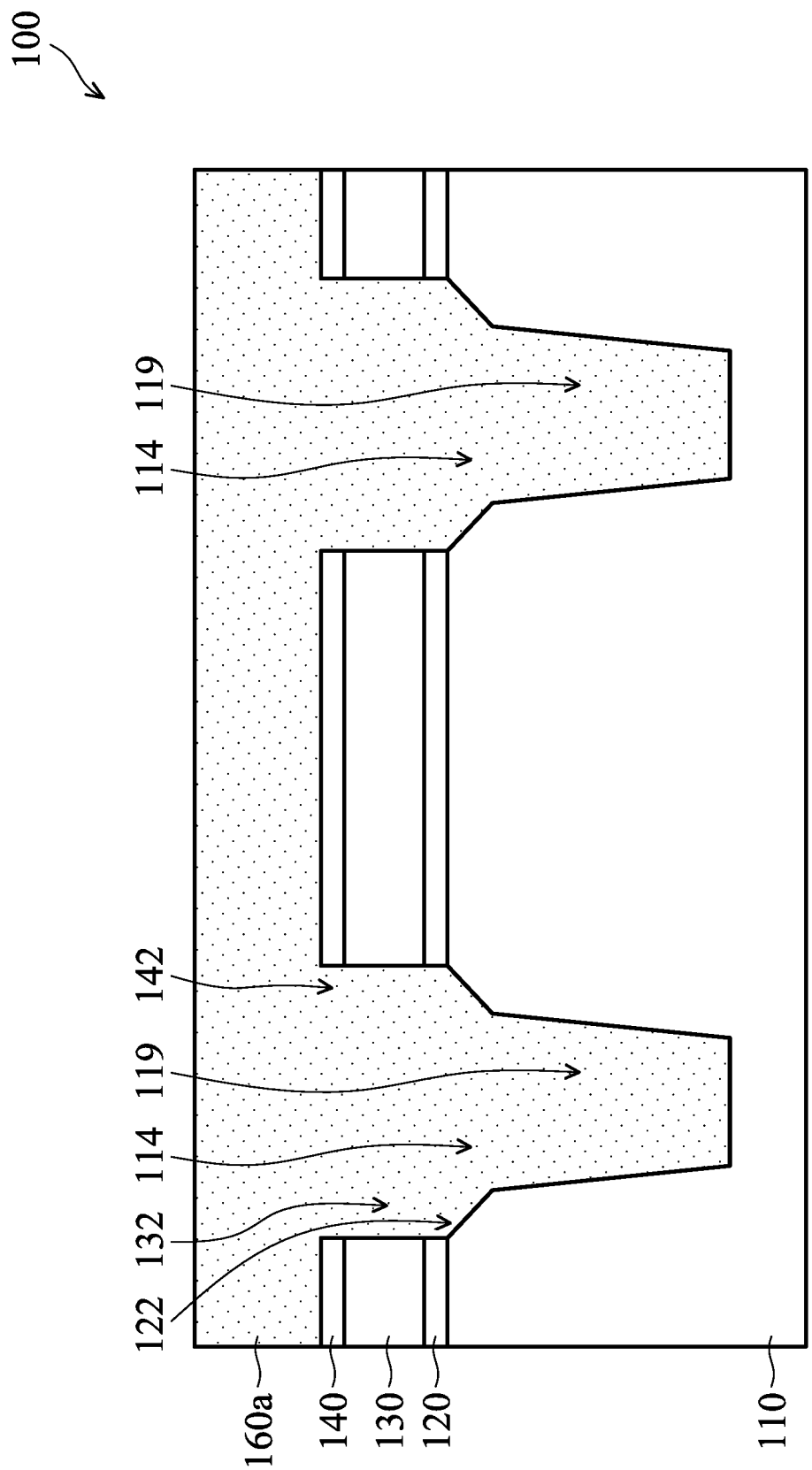

As shown in FIG. 1G, an insulating layer 160a is deposited over the substrate 110 to fill the trenches 114 and 119, in accordance with some embodiments. The insulating layer 160a fills the openings 122, 132, and 142 and covers the anti-reflective layer 140, the mask layers 120 and 130, and the substrate 110, in accordance with some embodiments. The insulating layer 160a includes oxide (such as silicon oxide), in accordance with some embodiments. The insulating layer 160a may be formed by a chemical vapor deposition (CVD) process.

Figure 1H:
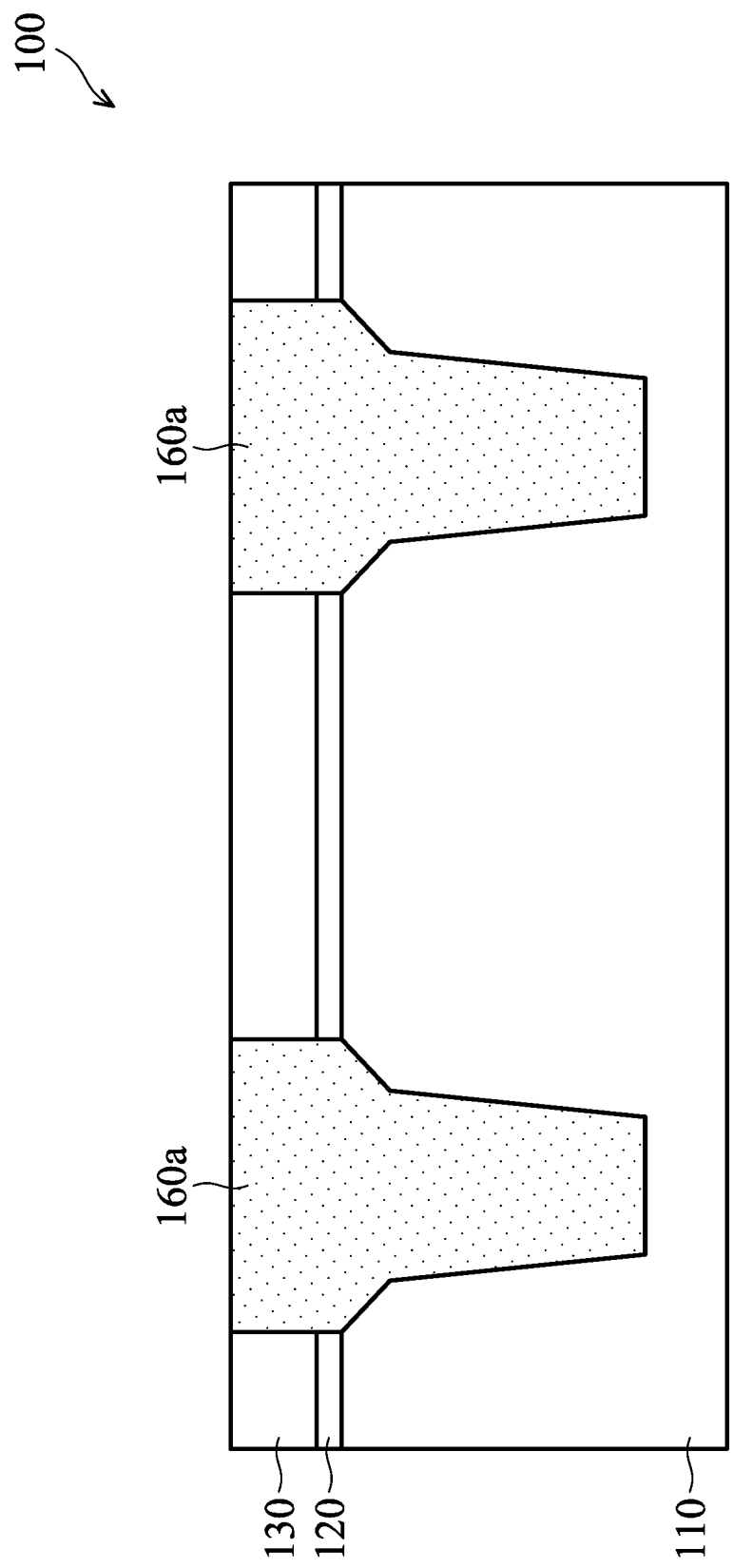
Figure 1I:
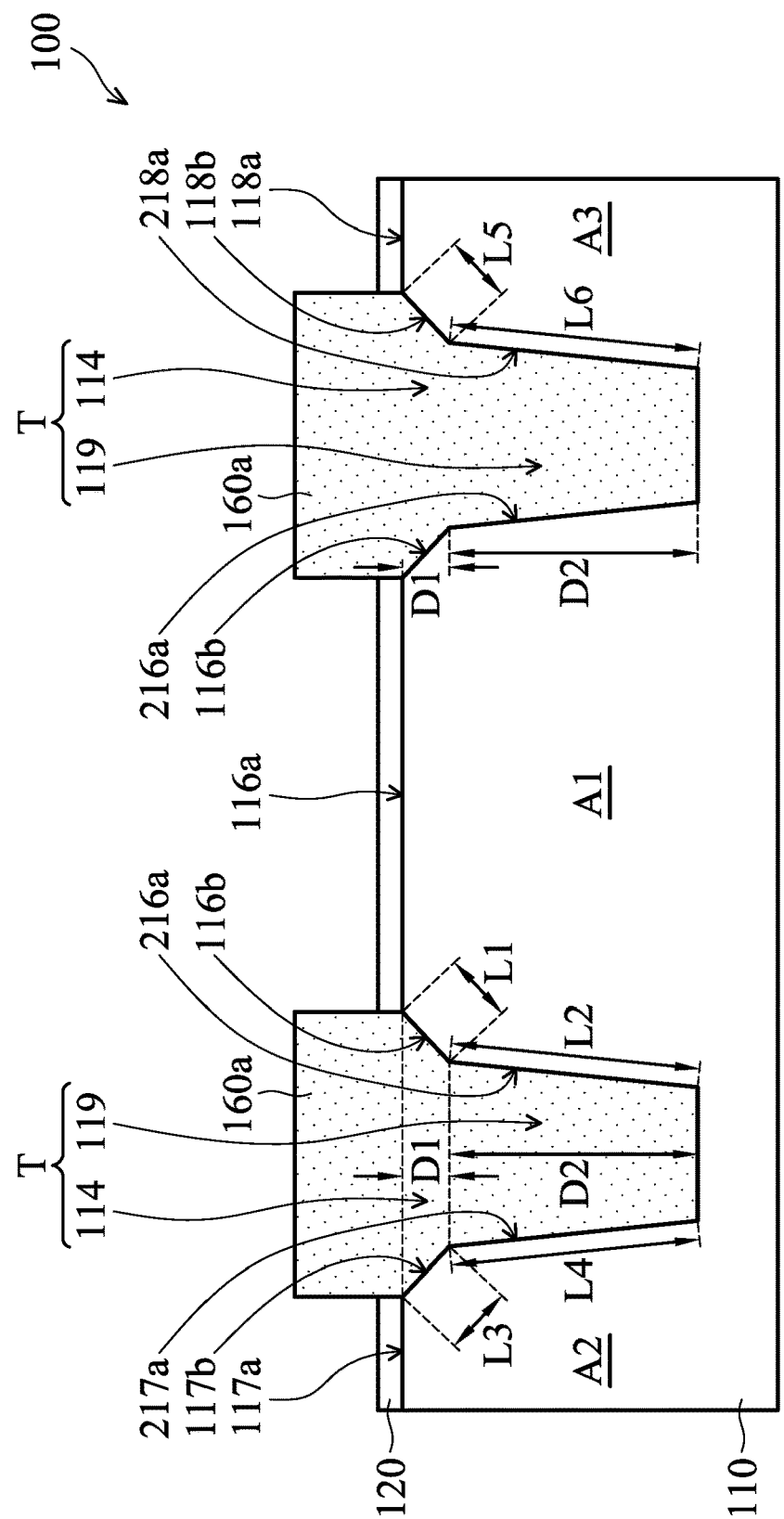

As shown in FIG. 1H, the anti-reflective layer 140 and the insulating layer 160a over the anti-reflective layer 140 are removed, in accordance with some embodiments. The removal process includes a chemical mechanical polishing (CMP) process, in accordance with some embodiments. As shown in FIG. 1I, the mask layer 130 is removed, in accordance with some embodiments. The removal process includes a wet etching process, in accordance with some embodiments.

The trench T adjacent to the inclined surface 116b, 117b, or 118b (i.e. the trench 114) has a first depth D1, in accordance with some embodiments. The trench T adjacent to the sidewall 216a, 217a, or 218a (i.e. the trench 119) has a second depth D2, in accordance with some embodiments. The second depth D2 is greater than the first depth D1, in accordance with some embodiments.

The inclined surface 116b has a length L1, in accordance with some embodiments. The sidewall 216a has a length L2, in accordance with some embodiments. The length L2 is greater than the length L1, in accordance with some embodiments.

The inclined surface 117b has a length L3, in accordance with some embodiments. The sidewall 217a has a length L4, in accordance with some embodiments. The length L4 is greater than the length L3, in accordance with some embodiments.

The inclined surface 118b has a length L5, in accordance with some embodiments. The sidewall 218a has a length L6, in accordance with some embodiments. The length L6 is greater than the length L5, in accordance with some embodiments.

Figure 1J:
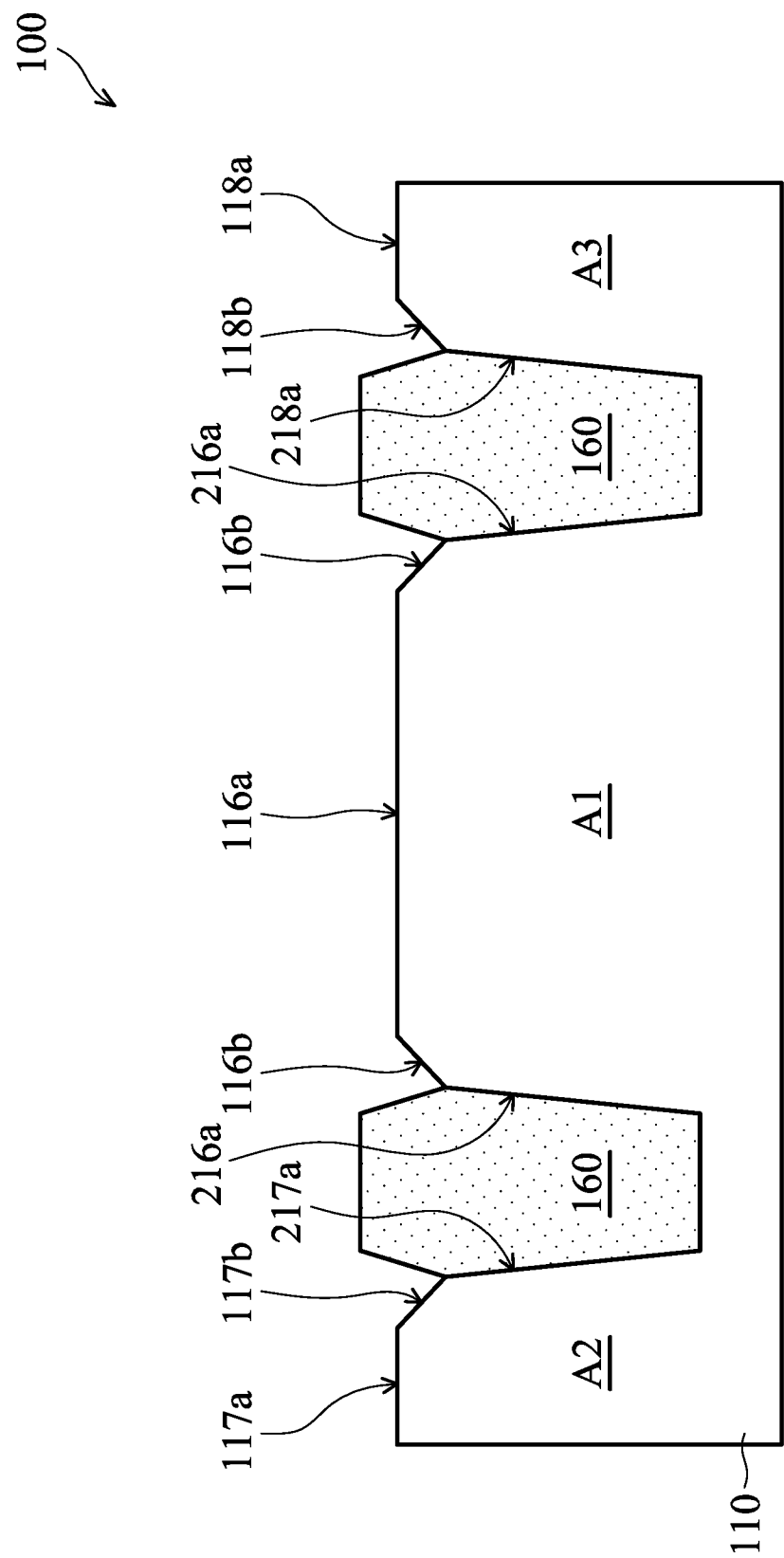

As shown in FIG. 1J, the mask layer 120 is removed, in accordance with some embodiments. The removal process includes a dry etching process and/or a wet etching process, in accordance with some embodiments. In some embodiments, the removal process also removes an upper portion of the insulating layer 160a to form an isolation structure 160.

The isolation structure 160 does not cover the inclined surfaces 116b, 117b, and 118b, in accordance with some embodiments. The isolation structure 160 exposes the entire inclined surfaces 116b, 117b, and 118b, in accordance with some embodiments. The isolation structure 160 covers the sidewalls 216a, 217a, and 218a, in accordance with some embodiments.

Figure 1K:
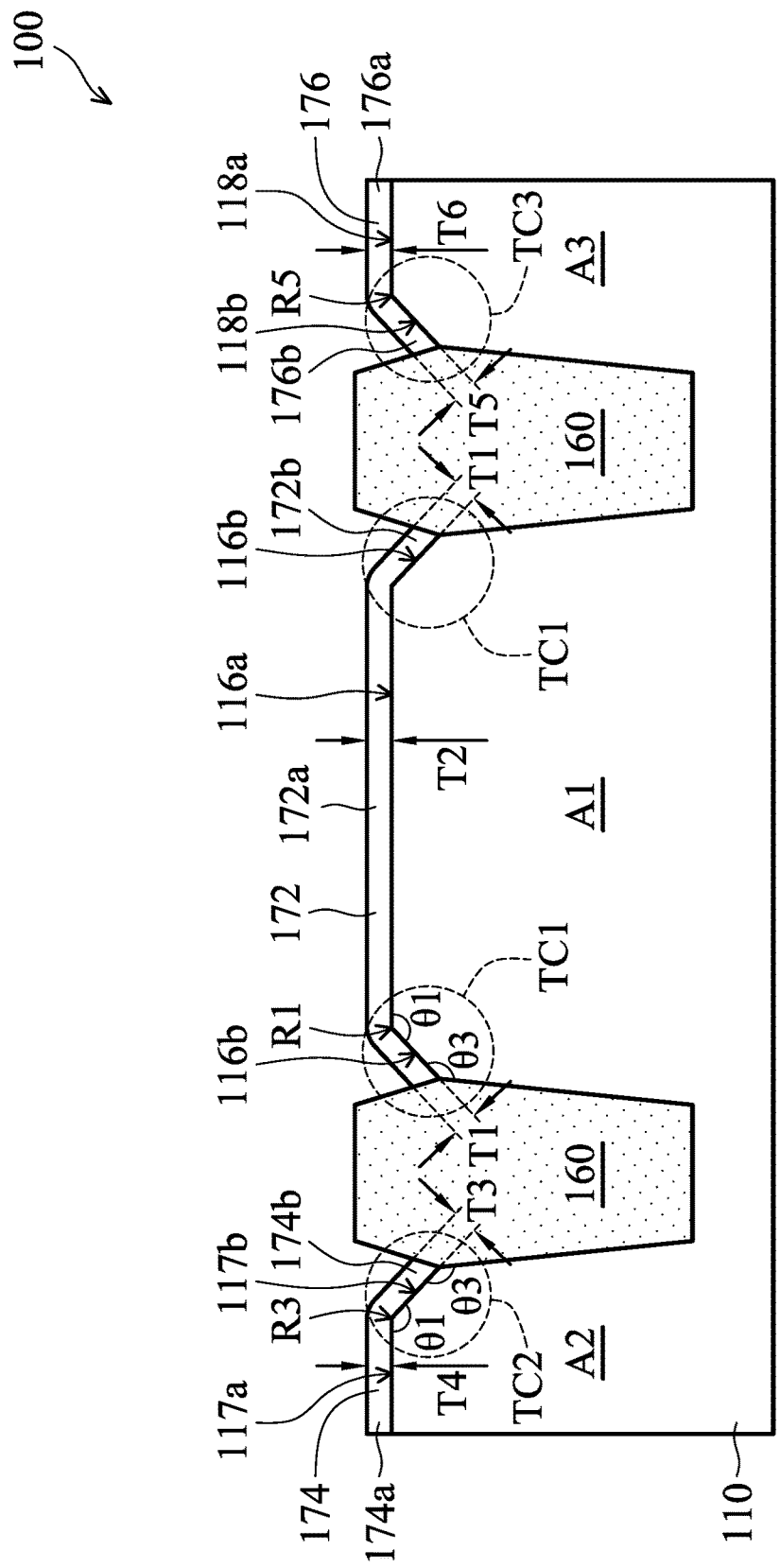

As shown in FIG. 1K, gate insulating layers 172, 174, and 176 are formed over the active islands A1, A2, and A3 respectively, in accordance with some embodiments. The gate insulating layers 172, 174, and 176 includes oxide (such as silicon oxide), in accordance with some embodiments.

The gate insulating layers 172, 174, and 176 are formed using a thermal oxidation process, in accordance with some embodiments. The gate insulating layers 172, 174, and 176 includes an oxide of a material of the active islands A1, A2, and A3 respectively, in accordance with some embodiments.

The embodiments perform the taper etching process to form the inclined surface 116b between the top surface 116a and the sidewall 216a, and the first angle θ1 between the top surface 116a and the inclined surface 116b is greater than the second angle θ2 between the top surface 116a and the sidewall 216a (as shown in FIG. 1F). Therefore, the formation of the inclined surface 116b may reduce the stress at the top corner TC1 of the active island A1. The stress at the top corner TC1 of the active island A1 is resulted from the small angle θ2 between the top surface 116a and the sidewall 216a.

Since the stress is reduced, the formation of the gate insulating layer 172 over the top corner TC1 of the active island A1 is improved. Similarly, the formation of the gate insulating layers 174 and 176 over the top corners TC2 and TC3 of the active island A2 and A3 is improved as well.

The gate insulating layer 172 covers the top surface 116a, the ridge line R1, and the inclined surface 116b, in accordance with some embodiments. The gate insulating layer 172 continuously covers the top surface 116a, the ridge line R1, and the inclined surface 116b, in accordance with some embodiments. The gate insulating layer 172 is a continuous layer, in accordance with some embodiments.

The gate insulating layer 172 includes portions 172a and 172b, in accordance with some embodiments. The portion 172a is over the top surface 116a, and the portion 172b is over the inclined surface 116b, in accordance with some embodiments. The portion 172b has a thickness T1, and the portion 172a has a thickness T2, in accordance with some embodiments. The thickness T1 is equal to or greater than the thickness T2, in accordance with some embodiments.

The inclined surface 116b includes a (110) crystal orientation, in accordance with some embodiments. The top surface 116a includes a (100) crystal orientation, in accordance with some embodiments. The oxidation rate of the (110) crystal orientation is greater than the oxidation rate of the (100) crystal orientation, in accordance with some embodiments. Therefore, the thickness T1 is equal to or greater than the thickness T2, in accordance with some embodiments.

The gate insulating layer 174 covers the top surface 117a, the ridge line R3, and the inclined surface 117b, in accordance with some embodiments. The gate insulating layer 174 continuously covers the top surface 117a, the ridge line R3, and the inclined surface 117b, in accordance with some embodiments. The gate insulating layer 174 is a continuous layer, in accordance with some embodiments.

The gate insulating layer 174 includes portions 174a and 174b, in accordance with some embodiments. The portion 174a is over the top surface 117a, and the portion 174b is over the inclined surface 117b, in accordance with some embodiments. The portion 174b has a thickness T3, and the portion 174a has a thickness T4, in accordance with some embodiments. The thickness T3 is equal to or greater than the thickness T4, in accordance with some embodiments.

The inclined surface 117b includes a (110) crystal orientation, in accordance with some embodiments. The top surface 117a includes a (100) crystal orientation, in accordance with some embodiments. The oxidation rate of the (110) crystal orientation is greater than the oxidation rate of the (100) crystal orientation, in accordance with some embodiments. Therefore, the thickness T3 is equal to or greater than the thickness T4, in accordance with some embodiments.

The gate insulating layer 176 covers the top surface 118a, the ridge line R5, and the inclined surface 118b, in accordance with some embodiments. The gate insulating layer 176 continuously covers the top surface 118a, the ridge line R5, and the inclined surface 118b, in accordance with some embodiments. The gate insulating layer 176 is a continuous layer, in accordance with some embodiments.

The gate insulating layer 176 includes portions 176a and 176b, in accordance with some embodiments. The portion 176a is over the top surface 118a, and the portion 176b is over the inclined surface 118b, in accordance with some embodiments. The portion 176b has a thickness T5, and the portion 176a has a thickness T6, in accordance with some embodiments. The thickness T5 is equal to or greater than the thickness T6, in accordance with some embodiments.

The inclined surface 118b includes a (110) crystal orientation, in accordance with some embodiments. The top surface 118a includes a (100) crystal orientation, in accordance with some embodiments. The oxidation rate of the (110) crystal orientation is greater than the oxidation rate of the (100) crystal orientation, in accordance with some embodiments. Therefore, the thickness T5 is equal to or greater than the thickness T6, in accordance with some embodiments.

Figure 1L:
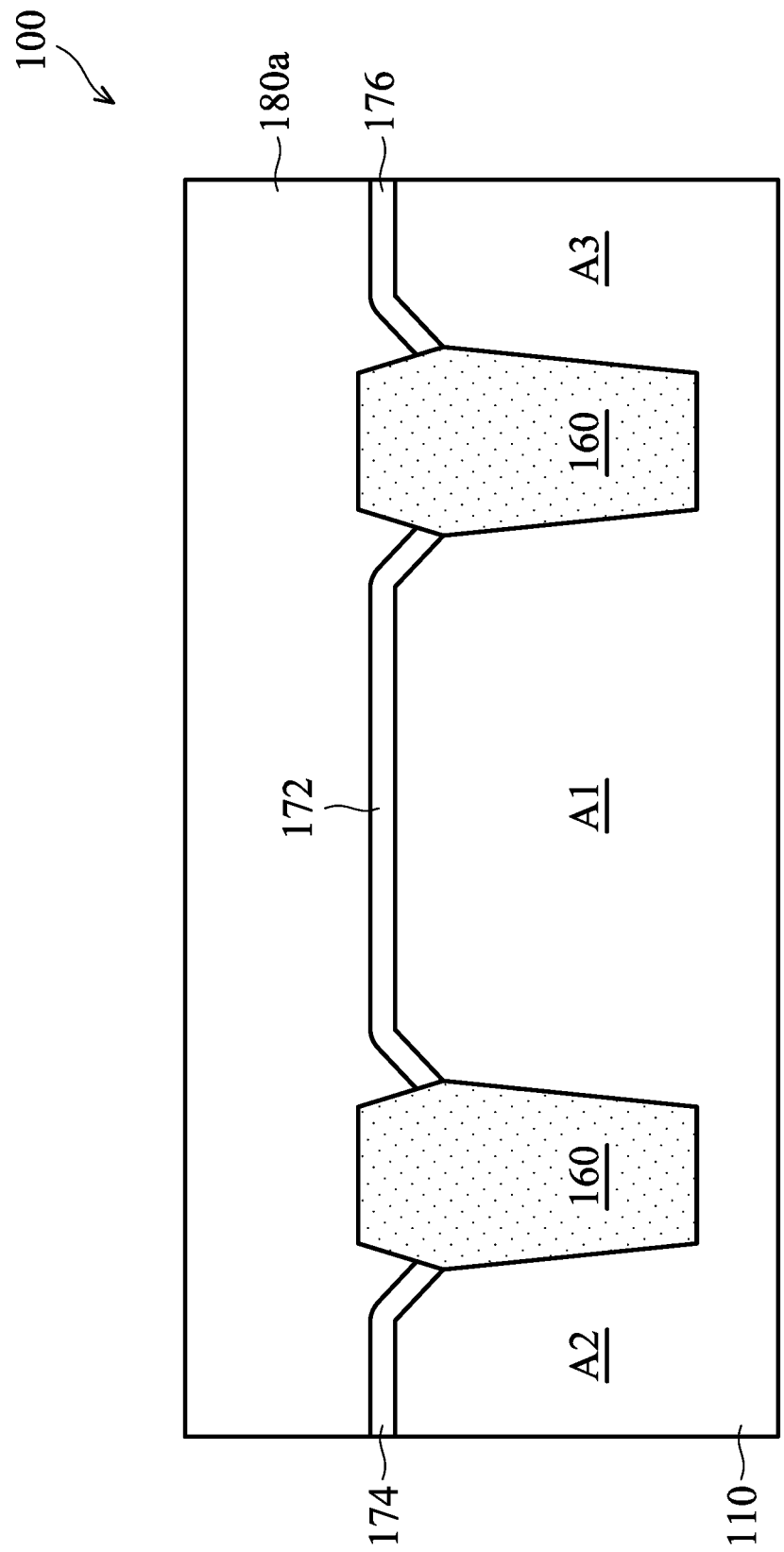

As shown in FIG. 1L, a gate material layer 180a is deposited over the gate insulating layers 172, 174, and 176, in accordance with some embodiments. The gate material layer 180a is deposited using a chemical vapor deposition process or a physical vapor deposition process, in accordance with some embodiments. The gate material layer 180a includes a polysilicon material or another suitable conductive material.

Figure 1M:
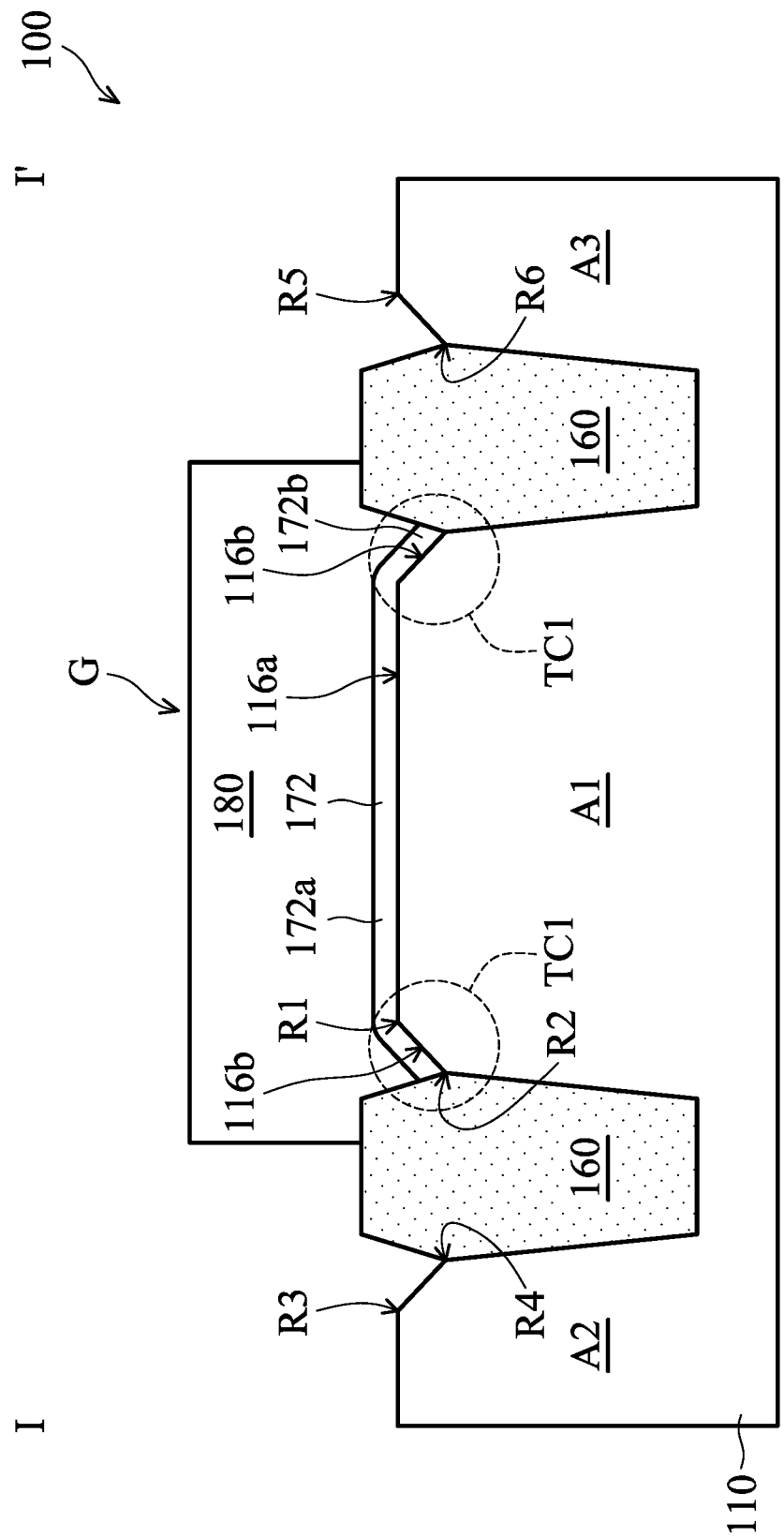
Figure 2C:
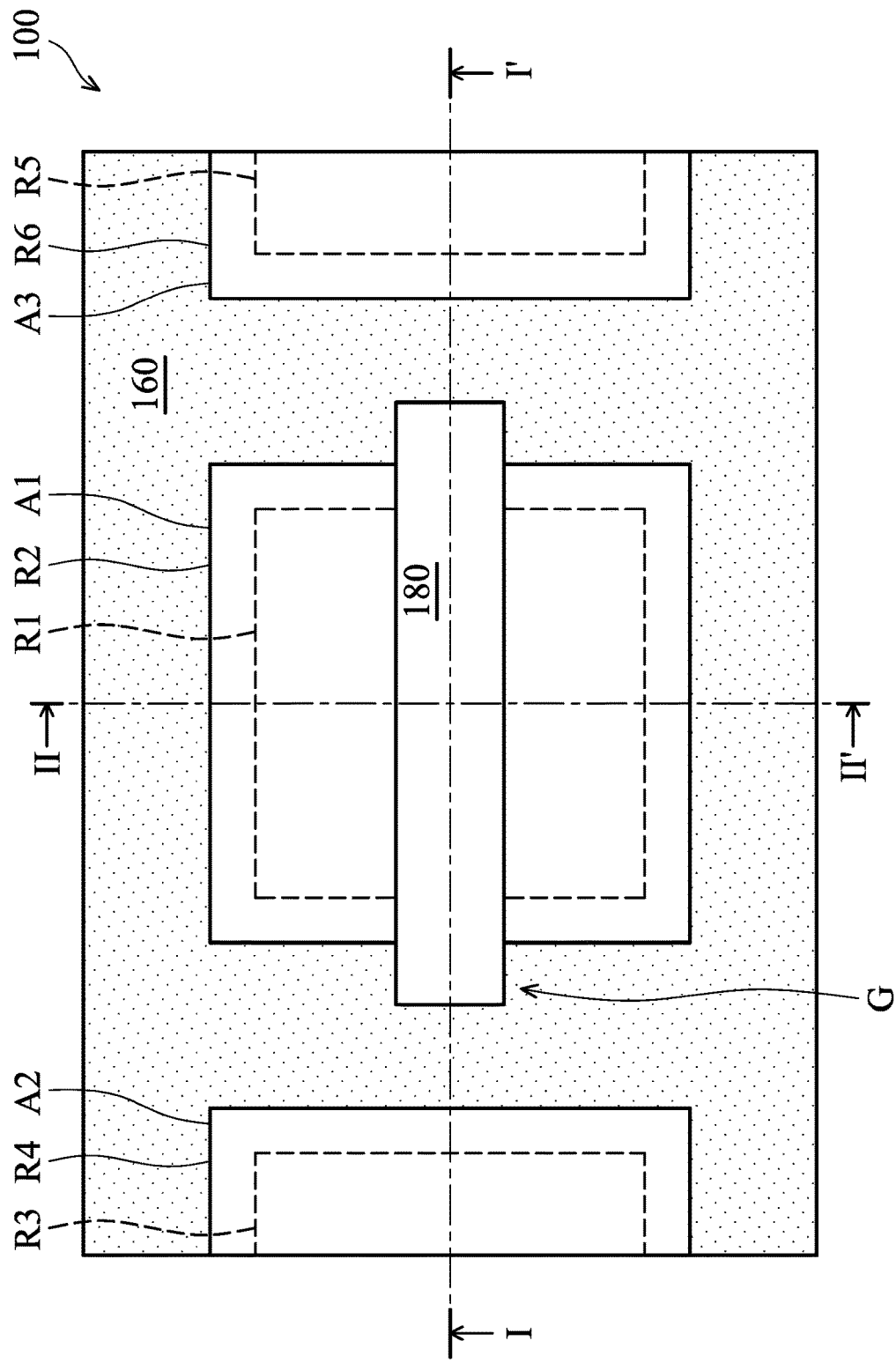
FIG. 2C is a top view of the semiconductor device structure of FIG. 1M, in accordance with some embodiments.
Figure 4A:
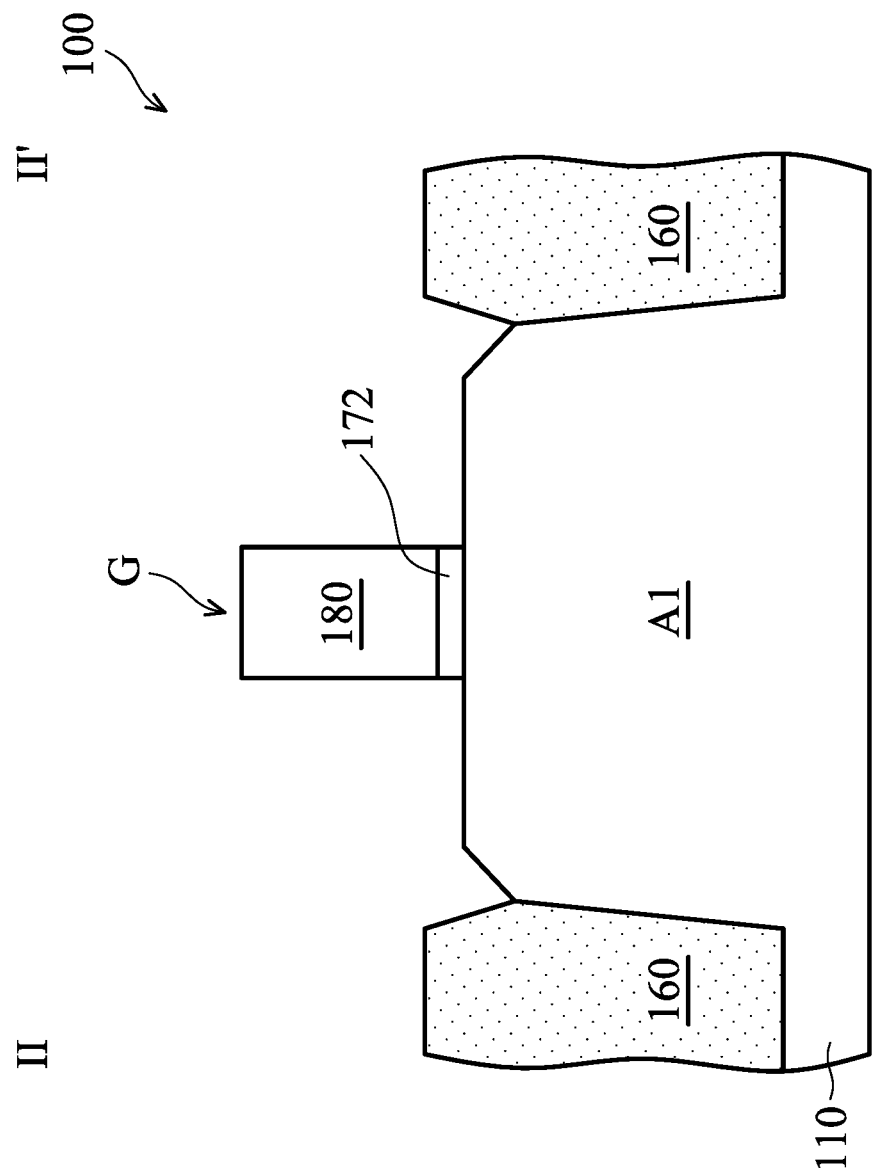
FIGS. 4A-4D are cross-sectional views of various stages of a process for forming a semiconductor device structure, in accordance with some embodiments.

FIG. 2C is a top view of the semiconductor device structure 100 of FIG. 1M, in accordance with some embodiments. FIG. 1M is a cross-sectional view illustrating the semiconductor device structure 100 along a sectional line I-I' in FIG. 2C, in accordance with some embodiments. FIG. 4A is a cross-sectional view illustrating the semiconductor device structure 100 along a sectional line II-II' in FIG. 2C, in accordance with some embodiments.

As shown in FIGS. 1M, 2C, and 4A, portions of the gate insulating layers 172, 174, and 176 and the gate material layer 180a are removed, in accordance with some embodiments. The remaining gate material layer 180a forms a gate 180 over the gate insulating layer 172, in accordance with some embodiments. The gate 180 and the gate insulating layer 172 together form a gate stack G, in accordance with some embodiments. The removal process includes a photolithography process and an etching process, in accordance with some embodiments.

The gate 180 is over the gate insulating layer 172 and the isolation structure 160, in accordance with some embodiments. The gate 180 crosses the active island A1, in accordance with some embodiments. The gate insulating layer 172 is in direct contact with the active island A1, the isolation structure 160, and the gate 180, in accordance with some embodiments. The gate insulating layer 172 separates the gate 180 from the active island A1, in accordance with some embodiments.

Since the formation of the gate insulating layer 172 over the active island A1, especially over the top corner TC1, is improved by the formation of the inclined surface 116b, the gate insulating layer 172 is able to electrically insulate the gate 180 from the active island A1. Since the thickness T1 of the gate insulating layer 172 over the inclined surface 116b is equal to or greater than the thickness T2 of the gate insulating layer 172 over the top surface 116a (as shown in FIG. 1K), the reliability of the gate insulating layer 172 is improved, in accordance with some embodiments.

Figure 4B:
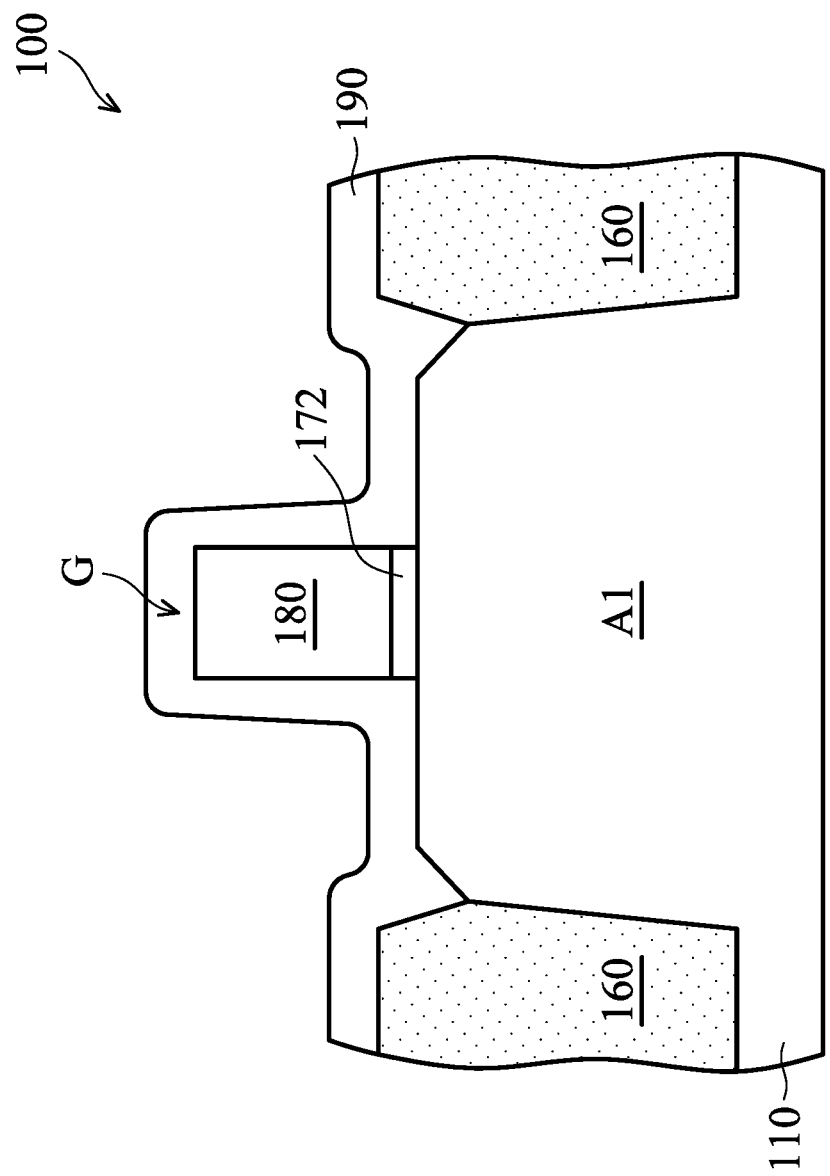

FIGS. 4A-4D are cross-sectional views of various stages of a process for forming a semiconductor device structure, in accordance with some embodiments. After the step of FIG. 4A, as shown in FIG. 4B, a spacer layer 190 is deposited over the substrate 110 to cover the gate stack G, in accordance with some embodiments. The spacer layer 190 is deposited using a CVD process, in accordance with some embodiments. The spacer layer 190 includes insulating materials, such as silicon oxide or silicon nitride, in accordance with some embodiments.

Figure 4C:
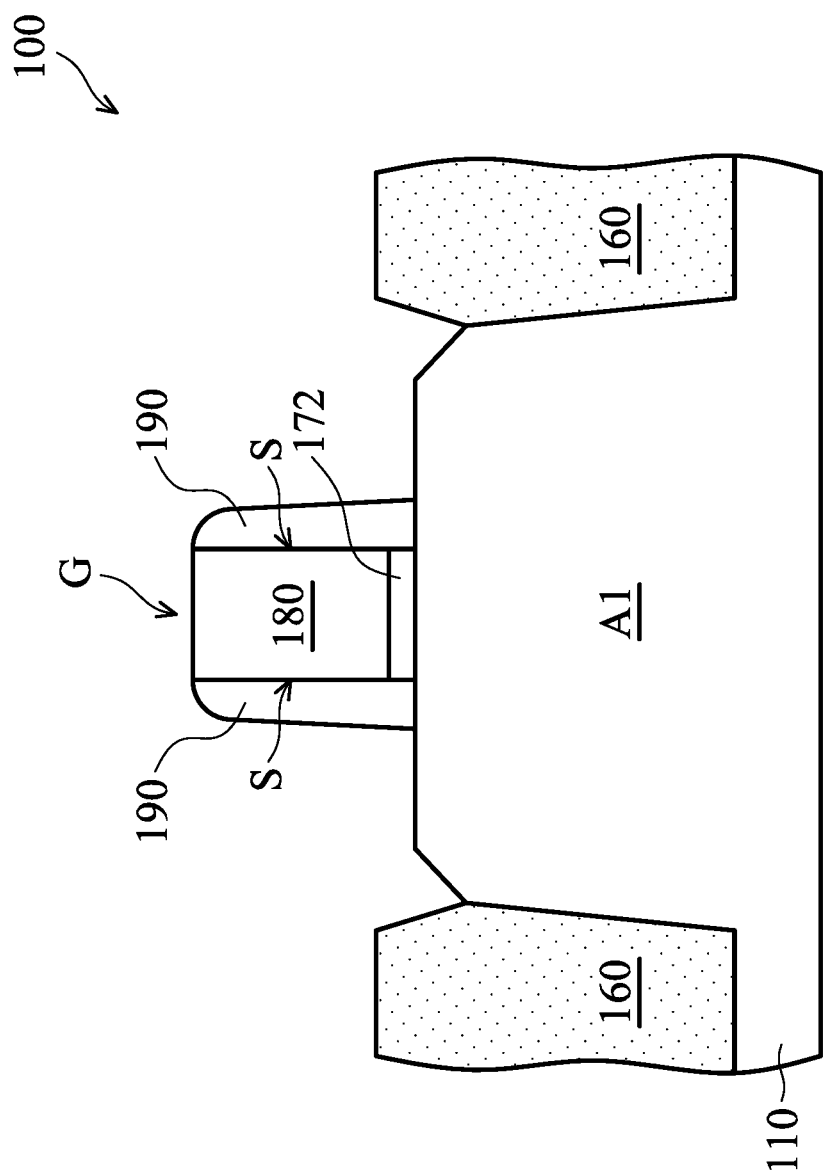

As shown in FIG. 4C, a portion of the spacer layer 190 is removed, in accordance with some embodiments. The spacer layer 190 remains over the sidewalls S of the gate stack G, in accordance with some embodiments. The spacer layer 190 is configured to electrically isolate the gate 180 from other devices and to act as a mask layer in a subsequent ion implantation process, in accordance with some embodiments. The removal process includes an anisotropic etching process (such as a dry etching process), in accordance with some embodiments.

Figure 4D:
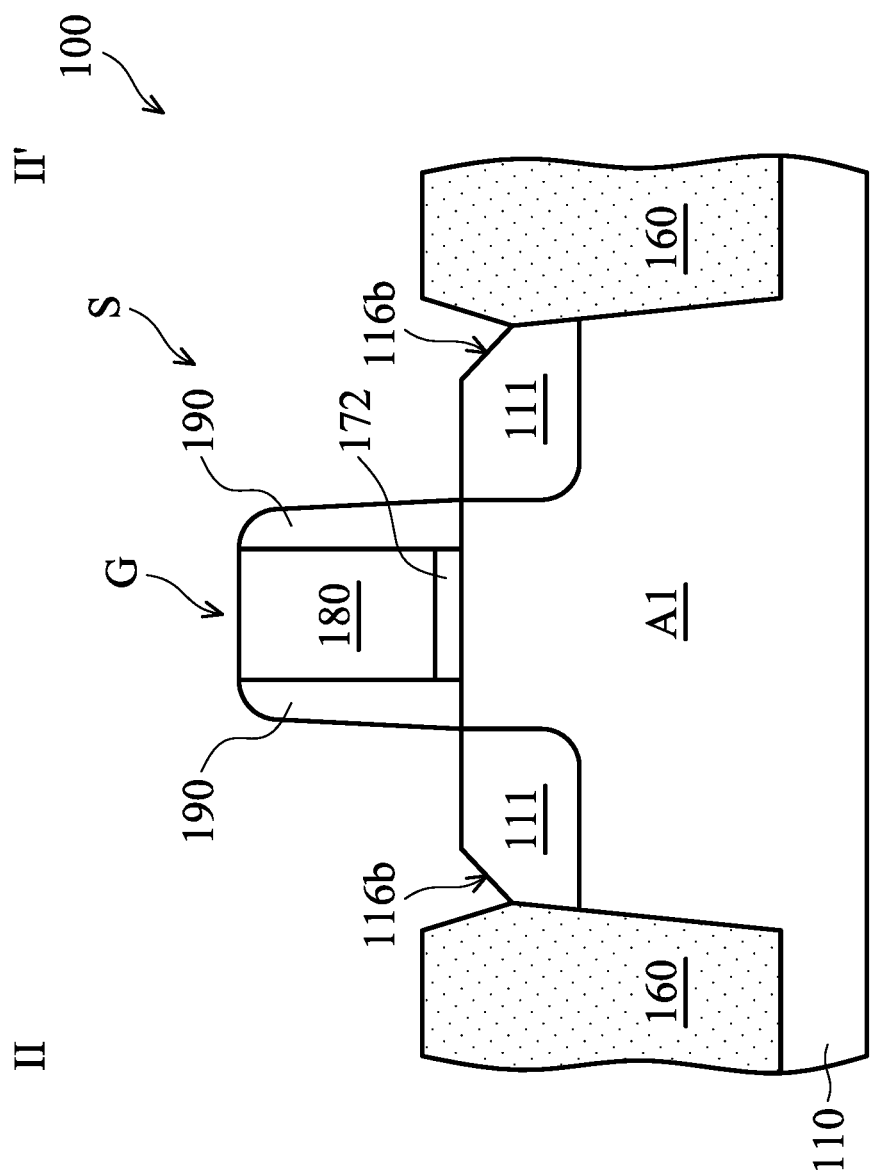
Figure 5:
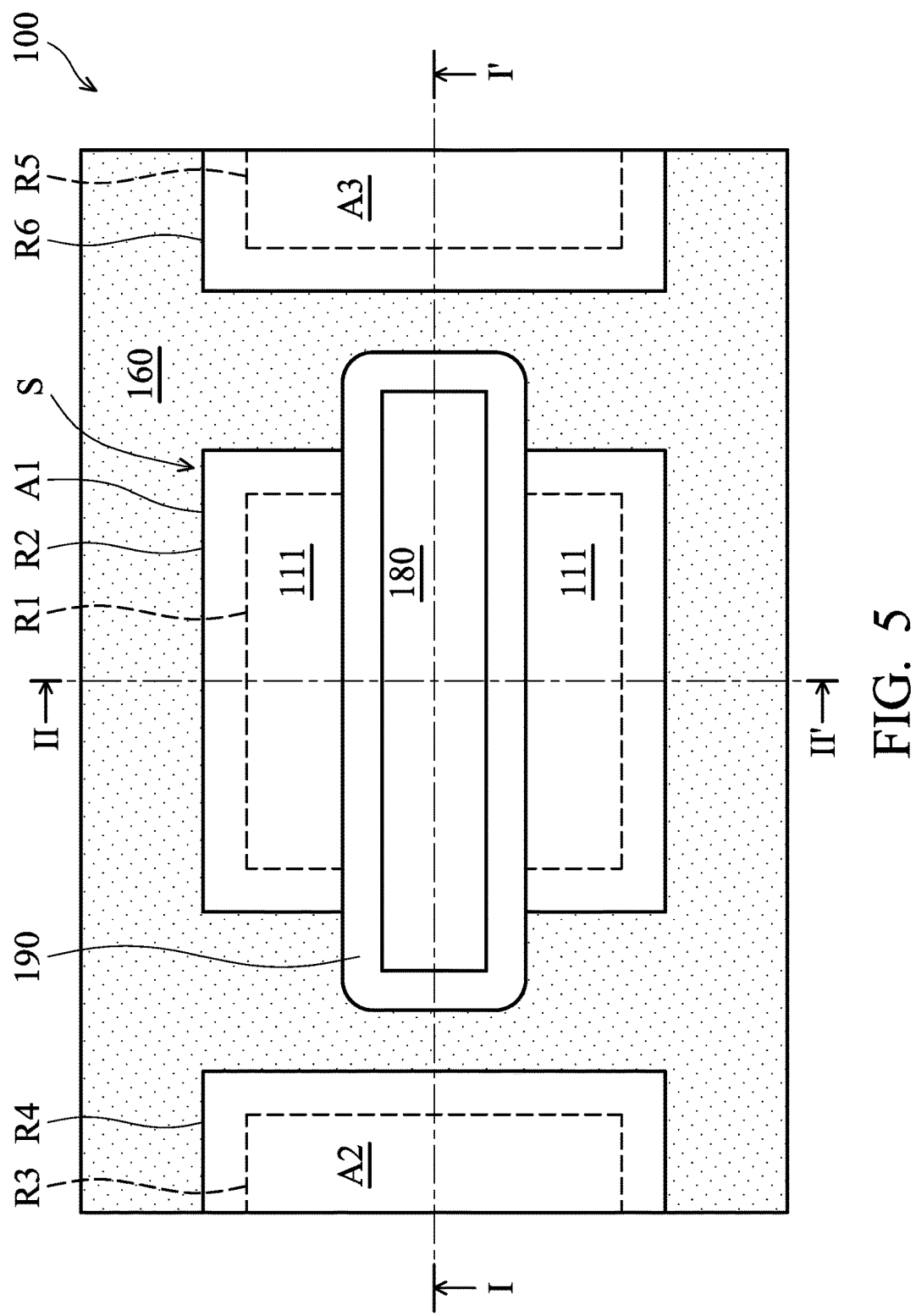
FIG. 5 is a top view of the semiconductor device structure of FIG. 4D, in accordance with some embodiments.
Figure 6:
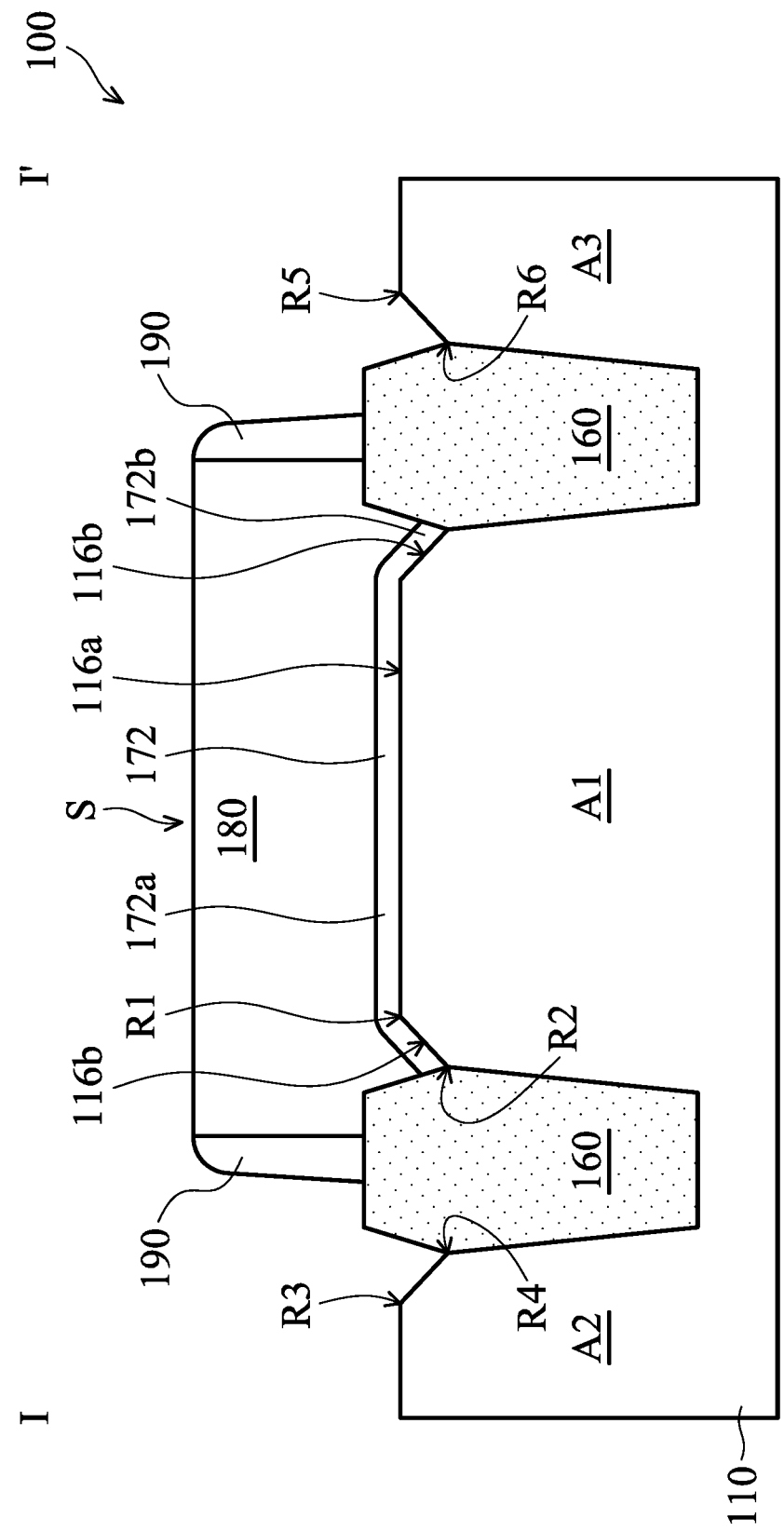
FIG. 6 is a cross-sectional view illustrating the semiconductor device structure along a sectional line I-I' in FIG. 5, in accordance with some embodiments.

FIG. 5 is a top view of the semiconductor device structure 100 of FIG. 4D, in accordance with some embodiments. FIG. 4D is a cross-sectional view illustrating the semiconductor device structure 100 along a sectional line II-II' in FIG. 5, in accordance with some embodiments. FIG. 6 is a cross-sectional view illustrating the semiconductor device structure 100 along a sectional line I-I' in FIG. 5, in accordance with some embodiments.

As shown in FIGS. 4D, 5, and 6, doped regions 111 are formed in the semiconductor substrate 110, in accordance with some embodiments. The formation of the doped regions 111 includes as an ion implantation process, in accordance with some embodiments. The ion implantation process is performed to introduce p-type impurities (e.g., boron) or n-type impurities (e.g., phosphorus) into the semiconductor substrate 110, in accordance with some embodiments.

The doped regions 111 are a doped source region and a doped drain region, in accordance with some embodiments. The gate stack G is located between the doped regions 111, in accordance with some embodiments. The gate stack G, the spacer layer 190, and the doped regions 111 constitute a transistor device S, in accordance with some embodiments.

Since the formation of the inclined surface 116b helps the formation of the gate insulating layer 172 over the active island A1 to electrically insulate the gate 180 from the active island A1, the yield of the transistor device S is improved, in accordance with some embodiments. In some other embodiments, the gate 180 of the transistor device S is replaced by a metal gate.

In accordance with some embodiments, semiconductor device structures and methods for forming the same are provided. The methods (for forming the semiconductor device structure) form an inclined surface of a top corner of an active island to help the formation of a gate insulating layer over the active island, especially over the top corner. Therefore, the reliability of the gate insulating layer is improved, and the yield of the transistor device including the gate insulating layer is improved as well.

In accordance with some embodiments, a method for forming a semiconductor device structure is provided. The method includes performing a first plasma etching process on a substrate to form a first trench in the substrate. The first plasma etching process uses a first etching gas and a first deposition gas. The first trench surrounds a first portion of the substrate. The first portion has a top surface and a first inclined surface. The first inclined surface connects the top surface to a bottom surface of the first trench, and the first inclined surface is inclined relative to the top surface at a first angle. The method includes removing a second portion of the substrate under the bottom surface to form a second trench under and connected to the first trench. The second trench surrounds a third portion of the substrate under the first portion. The third portion has a first sidewall. The first sidewall is inclined relative to the top surface at a second angle, and the first angle is greater than the second angle. The method includes forming an isolation structure in the first trench and the second trench. The method includes forming a gate insulating layer over the top surface and the first inclined surface. The method includes forming a gate over the gate insulating layer and the isolation structure. The gate crosses the first portion.

In accordance with some embodiments, a method for forming a semiconductor device structure is provided. The method includes performing a first plasma etching process on a substrate to form a first trench in the substrate. The first plasma etching process uses a first etching gas and a first deposition gas, and the first trench has a bottom surface. The method includes performing a second plasma etching process on the bottom surface to form a second trench. The second plasma etching process uses a second etching gas and a second deposition gas. A first concentration of the first deposition gas is greater than a second concentration of the second deposition gas. The method includes forming an isolation structure in the first trench and the second trench. The method includes forming a gate insulating layer over the substrate. The method includes forming a gate over the gate insulating layer.

In accordance with some embodiments, a method for forming a semiconductor device structure is provided. The method includes performing a first plasma etching process on a substrate to form a first trench in the substrate. The first plasma etching process uses a first etching gas and a first deposition gas. The first trench surrounds a first portion of the substrate. The first portion has a top surface and a first inclined surface. The first inclined surface connects the top surface to a bottom surface of the first trench, and the first inclined surface is inclined relative to the top surface at a first angle. The method includes removing a second portion of the substrate under the bottom surface to form a second trench under and connected to the first trench. The second trench surrounds a third portion of the substrate under the first portion. The third portion has a first sidewall. The first sidewall is inclined relative to the top surface at a second angle, and the first angle is greater than the second angle. The method includes forming an isolation structure in the first trench and the second trench. The method includes after the formation of the isolation structure, performing an oxidation process on the substrate to form a continuous gate insulating layer on the top surface and the first inclined surface. The method includes forming a gate over the gate insulating layer and the isolation structure. The gate crosses the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
performing a first plasma etching process on a substrate to form a first trench in the substrate, wherein the first plasma etching process uses a first etching gas and a first deposition gas, the first trench surrounds a first portion of the substrate, the first portion has a top surface and a first inclined surface, the first inclined surface connects the top surface to a bottom surface of the first trench, and the first inclined surface is inclined relative to the top surface at a first angle;
removing a second portion of the substrate under the bottom surface to form a second trench under and connected to the first trench, wherein the second trench surrounds a third portion of the substrate under the first portion, the third portion has a first sidewall, the first sidewall is inclined relative to the top surface at a second angle, and the first angle is greater than the second angle;
forming an isolation structure in the first trench and the second trench, wherein the isolation structure has a second inclined surface, and the first inclined surface and the second inclined surface form second sidewalls of a recess;
forming a gate insulating layer over the top surface and the first inclined surface, wherein the gate insulating layer extends into the recess and partially covers the second inclined surface, the recess is filled with the gate and the gate insulating layer, and the gate is over the isolation structure partially; and
forming a gate over the gate insulating layer and the isolation structure, wherein the gate crosses the first portion, and the gate extends into the recess.

2. The method for forming a semiconductor device structure as claimed in claim 1, wherein the first deposition gas comprises $CH_2F_2$, $CH_3F$, or $CHF_3$.

3. The method for forming a semiconductor device structure as claimed in claim 1, wherein the formation of the first trench comprises:
forming a mask layer over the substrate, wherein the mask layer has an opening exposing a fourth portion of the substrate; and
performing the first plasma etching process to remove the fourth portion of the substrate through the opening so as to form the first trench.

4. The method for forming a semiconductor device structure as claimed in claim 3, wherein the formation of the second trench comprises:
performing a second plasma etching process to remove the second portion of the substrate through the opening and the first trench so as to form the second trench.

5. The method for forming a semiconductor device structure as claimed in claim 4, wherein the second plasma etching process uses a second etching gas and a second deposition gas.

6. The method for forming a semiconductor device structure as claimed in claim 5, wherein the second deposition gas comprises $CH_2F_2$, $CH_3F$, or $CHF_3$.

7. The method for forming a semiconductor device structure as claimed in claim 5, wherein the formation of the isolation structure comprises:
forming an insulating layer over the mask layer and in the opening, the first trench, and the second trench;
removing the insulating layer outside of the opening, the first trench, and the second trench; and
removing the mask layer.

8. A method for forming a semiconductor device structure, comprising:
performing a first plasma etching process on a substrate to form a first trench in the substrate, wherein the first plasma etching process uses a first etching gas and a first deposition gas, and the first trench has a bottom surface;
performing a second plasma etching process on the bottom surface to form a second trench, wherein the second plasma etching process uses a second etching gas and a second deposition gas, a first concentration of the first deposition gas is greater than a second concentration of the second deposition gas;
forming an isolation structure in the first trench and the second trench;
forming a gate insulating layer over the substrate; and
forming a gate over the gate insulating layer,
wherein the first trench has a first sidewall with a first slope, the second trench has a second sidewall with a second slope, and the first slope is less than second slope, the isolation structure has an inclined surface, the first sidewall and the inclined surface form third sidewalls of a recess, the gate insulating layer extends into the recess and partially covers the inclined surface, the gate extends into the recess, the recess is filled with the gate and the gate insulating layer, and the gate is over the isolation structure partially.

9. The method for forming a semiconductor device structure as claimed in claim 8, wherein the first deposition gas comprises $CH_2F_2$, $CH_3F$, or $CHF_3$.

10. The method for forming a semiconductor device structure as claimed in claim 9, wherein the first deposition gas and the second deposition gas comprise a same deposition gas.

11. The method for forming a semiconductor device structure as claimed in claim 8, wherein the formation of the first trench and the second trench comprises:
forming a mask layer over the substrate, wherein the mask layer has an opening exposing a first portion of the substrate;
performing the first plasma etching process to remove the first portion of the substrate through the opening so as to form the first trench; and
performing the second plasma etching process to remove a second portion of the substrate under the bottom surface through the opening and the first trench so as to form the second trench.

12. A method for forming a semiconductor device structure, comprising:
performing a first plasma etching process on a substrate to form a first trench in the substrate, wherein the first plasma etching process uses a first etching gas and a first deposition gas, the first trench surrounds a first portion of the substrate, the first portion has a top surface and a first inclined surface, the first inclined surface connects the top surface to a bottom surface of the first trench, and the first inclined surface is inclined relative to the top surface at a first angle;
removing a second portion of the substrate under the bottom surface to form a second trench under and connected to the first trench, wherein the second trench surrounds a third portion of the substrate under the first portion, the third portion has a first sidewall, the first sidewall is inclined relative to the top surface at a second angle, and the first angle is greater than the second angle;

forming an isolation structure in the first trench and the second trench;

after the formation of the isolation structure, performing an oxidation process on the substrate to form a continuous gate insulating layer on the top surface and the first inclined surface; and forming a gate over the gate insulating layer and the isolation structure, wherein the gate crosses the first portion, wherein the isolation structure has a second inclined surface, the first inclined surface and the second inclined surface form second sidewalls of a recess, the gate insulating layer extends into the recess and partially covers the second inclined surface, the gate extends into the recess, the recess is filled with the gate and the gate insulating layer, and the gate is over the isolation structure partially.

13. The method for forming a semiconductor device structure as claimed in claim 12, wherein during the oxidation process, a first oxidation rate of the substrate constituting the first inclined surface is greater than a second oxidation rate of the substrate constituting the top surface.

14. The method for forming a semiconductor device structure as claimed in claim 13, wherein the inclined surface comprises a (110) crystal orientation, the top surface comprises a (100) crystal orientation, the gate insulating layer has a fourth portion and a fifth portion, the fourth portion is over the first inclined surface, the fifth portion is over the top surface, and a first thickness of the fourth portion is greater than a second thickness of the fifth portion.

15. The method for forming a semiconductor device structure as claimed in claim 1, wherein the first etching gas comprises $CF_4$ or $C_4F_6$.

16. The method for forming a semiconductor device structure as claimed in claim 1, wherein the gate insulating layer conformally covers the first inclined surface.

17. The method for forming a semiconductor device structure as claimed in claim 8, wherein the first etching gas comprises $CF_4$ or $C_4F_6$.

18. The method for forming a semiconductor device structure as claimed in claim 8, wherein the gate insulating layer conformally covers the first sidewall.

19. The method for forming a semiconductor device structure as claimed in claim 12, wherein the first etching gas comprises $CF_4$ or $C_4F_6$.

20. The method for forming a semiconductor device structure as claimed in claim 12, wherein the gate insulating layer conformally covers the first inclined surface.

* * * * *